US012765102B2

(12) United States Patent
Choi et al.

(10) Patent No.: US 12,765,102 B2
(45) Date of Patent: Oct. 13, 2026

(54) IMAGE SENSOR

(71) Applicant: Samsung Electronics Co., Ltd., Suwon-si (KR)

(72) Inventors: Minjun Choi, Suwon-si (KR); Jihyun Kwak, Suwon-si (KR); Hyoeun Kim, Suwon-si (KR); Surim Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 223 days.

(21) Appl. No.: 18/405,372

(22) Filed: Jan. 5, 2024

(65) Prior Publication Data

US 2024/0243153 A1 Jul. 18, 2024

(30) Foreign Application Priority Data

Jan. 17, 2023 (KR) ........................ 10-2023-0006783

(51) Int. Cl.
*H10F 39/00* (2025.01)
*H10W 20/40* (2026.01)
(Continued)

(52) U.S. Cl.
CPC ......... *H10F 39/809* (2025.01); *H10F 39/018* (2025.01); *H10F 39/811* (2025.01);
(Continued)

(58) Field of Classification Search
CPC .... H10F 39/809; H10F 39/811; H10F 39/018; H10F 39/199; H10F 39/182; H10W 80/312; H10W 80/327; H10W 90/792
See application file for complete search history.

(56) References Cited

U.S. PATENT DOCUMENTS

| | | | |
|---|---|---|---|
| 7,669,051 B2 | 2/2010 | Redlich et al. |
| 9,496,309 B2 | 11/2016 | Yang |

(Continued)

FOREIGN PATENT DOCUMENTS

| | | | |
|---|---|---|---|
| JP | 2011-129343 A | 6/2011 |
| JP | 5957840 B2 | 7/2016 |
| KR | 10-2022-0164105 A | 12/2022 |

OTHER PUBLICATIONS

Korean Office Action dated Sep. 1, 2026 for corresponding Korean Application No. 10-2023-0006783.

*Primary Examiner* — Bac H Au
(74) *Attorney, Agent, or Firm* — Harness, Dickey & Pierce, P.L.C.

(57) ABSTRACT

An image sensor is provided. The image sensor includes a first semiconductor chip including a first semiconductor substrate having a pixel unit, a first wiring structure having a first wiring layer, and a first bonding pad; a second semiconductor chip including a second semiconductor substrate having first and second surfaces, a second wiring structure on the first surface, contacting the first wiring structure, and having a second wiring layer, a second upper bonding pad bonded to the first bonding pad, and a via structure connected to the second wiring layer and extending to the second surface; a bonding layer including a bonding insulating layer on the second surface, and a second lower bonding pad connected to the via structure; and a third semiconductor chip including a third semiconductor substrate, a third wiring structure contacting the bonding insulating layer, and a third bonding pad bonded to the second lower bonding pad.

19 Claims, 21 Drawing Sheets

(51) Int. Cl.
*H10W 80/00* (2026.01)
*H10W 90/00* (2026.01)

(52) U.S. Cl.
CPC ........ *H10W 20/496* (2026.01); *H10W 80/312* (2026.01); *H10W 80/327* (2026.01); *H10W 90/792* (2026.01)

(56) References Cited

U.S. PATENT DOCUMENTS

| | | | | |
|---|---|---|---|---|
| 11,482,564 | B2* | 10/2022 | Yoon | H10F 39/018 |
| 2015/0372043 | A1* | 12/2015 | Sano | H10F 39/811<br>348/308 |
| 2019/0115387 | A1 | 4/2019 | Yamagishi et al. | |
| 2019/0363130 | A1 | 11/2019 | Yokoyama et al. | |
| 2020/0020733 | A1* | 1/2020 | Fujii | H01L 21/76898 |
| 2020/0035736 | A1 | 1/2020 | Nagahama | |
| 2020/0098815 | A1* | 3/2020 | Kameshima | H01L 25/18 |
| 2020/0266299 | A1 | 8/2020 | Chen et al. | |
| 2021/0104570 | A1 | 4/2021 | Mitsuhashi et al. | |
| 2021/0385403 | A1 | 12/2021 | Eki | |
| 2022/0077215 | A1 | 3/2022 | Horikoshi | |
| 2022/0392941 | A1 | 12/2022 | Kwon et al. | |
| 2023/0039809 | A1 | 2/2023 | Choi et al. | |
| 2023/0299109 | A1* | 9/2023 | Chung | H10F 39/018 |
| 2024/0178255 | A1* | 5/2024 | Kim | H10F 39/809 |
| 2025/0031476 | A1* | 1/2025 | Jang | H01L 23/5225 |

* cited by examiner

IMAGE SENSOR

CROSS-REFERENCE TO RELATED APPLICATION

This application claims benefit of priority to Korean Patent Application No. 10-2023-0006783 filed on Jan. 17, 2023 in the Korean Intellectual Property Office, the disclosure of which is incorporated herein by reference in its entirety.

BACKGROUND

Example embodiments of the present inventive concepts relate to image sensors.

An image sensor may be a semiconductor-based sensor configured to receive light and generate an electrical signal, and may include a pixel array having a plurality of unit pixels and a circuit for driving the pixel array and generating an image. The plurality of unit pixels may include a photodiode for generating electric charges in response to external light and a pixel circuit for converting electric charges generated by the photodiode into an electrical signal. An image sensor may be widely applied to a smartphone, a tablet PC, a laptop computer, a television, an automobile, and the like, in addition to a camera for obtaining images or videos.

SUMMARY

Some example embodiments of the present inventive concepts provide an image sensor having an improved bonding structure in a three-stack structure.

According to some example embodiments of the present inventive concepts, an image sensor includes a first semiconductor chip including a first semiconductor substrate having a pixel unit in which a plurality of pixels are arranged, a first wiring structure on the first semiconductor substrate and having a first wiring layer, and a first bonding pad exposed to one surface of the first wiring structure and connected to the first wiring layer; a second semiconductor chip including a second semiconductor substrate having a first surface on which at least a portion of a plurality of transistors of a pixel signal generator circuit are located and a second surface opposite to the first surface, a second wiring structure on the first surface of the second semiconductor substrate, the second wiring structure having one surface in contact with the one surface of the first wiring structure, the second wiring structure having a second wiring layer, a second upper bonding pad exposed to the one surface of the second wiring structure and bonded to the first bonding pad, and a via structure connected to the second wiring layer and extending to the second surface of the second semiconductor substrate; a bonding layer including a bonding insulating layer on the second surface of the second semiconductor substrate, and a second lower bonding pad buried in the bonding insulating layer, exposed to one surface of the bonding insulating layer, and connected to the via structure; and a third semiconductor chip including a third semiconductor substrate having one surface on which logic devices are located, a third wiring structure on the one surface of the third semiconductor substrate, the third wiring structure having one surface in contact with the one surface of the bonding insulating layer, and having a third wiring layer, and a third bonding pad exposed to the one surface of the third wiring structure, bonded to the second lower bonding pad, and connected to the third wiring layer.

According to some example embodiments of the present inventive concepts, an image sensor includes a first semiconductor chip including a first semiconductor substrate having a first region in which a plurality of pixels are arranged and a second region around the first region, a first wiring structure on a lower surface of the first semiconductor substrate and having a first wiring layer, and a first bonding pad exposed to the lower surface of the first wiring structure and connected to the first wiring layer; a second semiconductor chip including a second semiconductor substrate having an upper surface on which transistors of a pixel signal generator circuit are located and a lower surface having a recessed portion in a region overlapping the second region, a second wiring structure on the upper surface of the second semiconductor substrate, the second wiring structure in contact with the first wiring structure, the second wiring structure having a second wiring layer, a second upper bonding pad exposed to the upper surface of the second wiring structure and bonded to the first bonding pad, and a via structure connected to the second wiring layer and penetrating through the recessed portion of the second semiconductor substrate; a bonding layer including a bonding insulating layer on the lower surface of the second semiconductor substrate and extending to the recessed portion, and a second lower bonding pad buried in the bonding insulating layer, the second lower bonding pad exposed to the lower surface of the bonding insulating layer, the second lower bonding pad connected to the via structure in the recessed portion; and a third semiconductor chip including a third semiconductor substrate having an upper surface on which logic devices are formed, a third wiring structure on the upper surface of the third semiconductor substrate, the third wiring structure in contact with the bonding insulating layer, the third wiring structure having a third wiring layer, and a third bonding pad exposed to the upper surface of the third wiring structure, the third bonding pad bonded to the second lower bonding pad, the third bonding pad connected to the third wiring layer.

According to some example embodiments of the present inventive concepts, an image sensor includes a first semiconductor chip including a first semiconductor substrate having a first region in which a plurality of pixels are arranged and a second region around the first region, a first wiring structure on a lower surface of the first semiconductor substrate and having a first wiring layer, and a first bonding pad exposed to the lower surface of the first wiring structure and connected to the first wiring layer; a second semiconductor chip including a second semiconductor substrate having an upper surface on which transistors of a pixel signal generator circuit are located, a second wiring structure on the upper surface of the second semiconductor substrate, the second wiring structure in contact with the first wiring structure, the second wiring structure having a second wiring layer, a second upper bonding pad exposed to an upper surface of the second wiring structure and bonded to the first bonding pad, and a via structure connected to the second wiring layer, the via structure penetrating through a region overlapping the second region of the second semiconductor substrate, the via structure having a protruding portion protruding from the lower surface of the second semiconductor substrate; a bonding layer including an etching stop layer on the lower surface of the second semiconductor substrate and surrounding an exposed portion of the via structure, a bonding insulating layer on the etching stop layer, and a second lower bonding pad buried in the bonding insulating layer, the second lower bonding pad exposed to a lower surface of the bonding insulating layer, the second lower bonding pad connected to the via structure; and a third semiconductor chip including a third semiconductor substrate having an upper surface on which logic devices are located, a third wiring structure on the upper surface of the third semiconductor substrate, the third wiring structure in contact with the bonding insulating layer, the third wiring structure having a third wiring layer, and a third bonding pad exposed to an upper surface of the third wiring structure, the third bonding pad bonded to the second lower bonding pad, the third bonding pad connected to the third wiring layer.

BRIEF DESCRIPTION OF DRAWINGS

The above and other aspects, features, and advantages of the present inventive concepts will be more clearly understood from the following detailed description, taken in combination with the accompanying drawings, in which.

DETAILED DESCRIPTION

Figure 1:
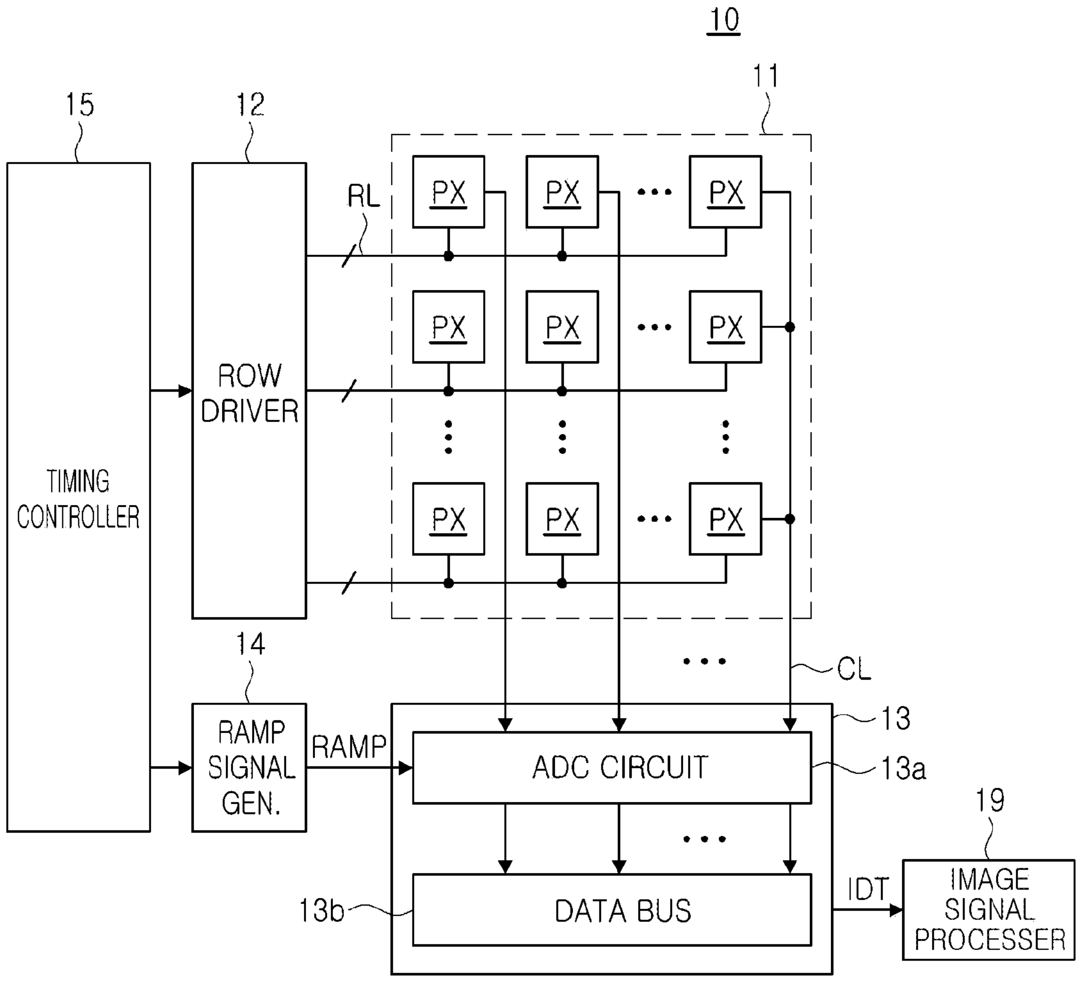
FIG. 1 is a block diagram illustrating an image sensor according to some example embodiments of the present inventive concepts.

Hereinafter, example embodiments of the present inventive concepts will be described as follows with reference to the accompanying drawings.

In the drawings, like reference characters denote like elements, and redundant descriptions thereof will be omitted. Further, in the drawings, the size and thickness of each element are arbitrarily illustrated for ease of description, and the present inventive concepts are not necessarily limited to those illustrated in the drawings.

Throughout the specification, when a part is “connected” to another part, it includes not only a case where the part is “directly connected” but also a case where the part is “indirectly connected” with another part in between. In addition, unless explicitly described to the contrary, the word “comprise” and variations such as “comprises” or “comprising” will be understood to imply the inclusion of stated elements but not the exclusion of any other elements.

It will be understood that when an element such as a layer, film, region, area, or substrate is referred to as being “on” or “above” another element, it can be directly on the other element or intervening elements may also be present. In contrast, when an element is referred to as being “directly on” another element, there are no intervening elements present. Further, in the specification, the word “on” or “above” means positioned on or below the object portion, and does not necessarily mean positioned on the upper side of the object portion based on a gravitational direction. For example, an element that is “on” another element may be above or beneath the other element.

The use of the term “the” and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being “perpendicular,” “parallel,” “coplanar,” or the like with regard to other elements and/or properties thereof (e.g., structures, surfaces, directions, or the like) may be “perpendicular,” “parallel,” “coplanar,” or the like or may be “substantially perpendicular,” “substantially parallel,” “substantially coplanar,” or the like, respectively, with regard to the other elements and/or properties thereof.

Elements and/or properties thereof (e.g., structures, surfaces, directions, or the like) that are “substantially perpendicular”, “substantially parallel”, or “substantially coplanar” with regard to other elements and/or properties thereof will be understood to be “perpendicular”, “parallel”, or “coplanar”, respectively, with regard to the other elements and/or properties thereof within manufacturing tolerances and/or material tolerances and/or have a deviation in magnitude and/or angle from “perpendicular”, “parallel”, or “coplanar”, respectively, with regard to the other elements and/or properties thereof that is equal to or less than 10% (e.g., a tolerance of ±10%).

It will be understood that elements and/or properties thereof may be recited herein as being “the same” as or “equal” to other elements, and it will be further understood that elements and/or properties thereof recited herein as being “identical” to, “the same” as, or “equal” to other elements may be “identical” to, “the same” as, or “equal” to or “substantially identical” to, “substantially the same” as or “substantially equal” to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element or a value within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect/structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 is a block diagram illustrating an image sensor according to some example embodiments.

Referring to FIG. 1, an image sensor 10 according to some example embodiments may include a pixel array 11, a row driver 12, a readout circuit 13, a ramp signal generator 14, a timing controller 15 and an image signal processor 19. The readout circuit 13 may include an analog-to-digital conversion circuit 13*a* (hereinafter, ADC circuit), and a data bus 13*b*.

The pixel array 11 may include a plurality of pixels PX arranged in rows and columns, and a plurality of row lines RL and a plurality of column lines CL connected to the plurality of pixels PX. Each of the plurality of row lines RL may extend in the row direction and may be connected to pixels PX disposed in the same row. For example, each of the plurality of row lines RL may transmit control signals output by the row driver 12 to each transistor of the pixel signal generator circuit (hereinafter, referred to as "pixel circuit") illustrated in FIG. 6 or FIG. 7. The pixel signal generator circuit employed in some example embodiments is not limited thereto, but may be configured as a global shutter circuit operating by a global shutter method (see FIGS. 6 and 7).

Each of the plurality of pixels PX (e.g., each pixel PX) may include at least one photoelectric conversion device (also referred to as a light sensing device). A photoelectric conversion device may sense light and may convert sensed light into photoelectric charge. For example, the photoelectric conversion device may be a light sensing device such as an inorganic photodiode or an organic photodiode.

A microlens for condensing light may be disposed on each of a plurality of pixels PX or on each of pixel groups including adjacent pixels PX. Each of the plurality of pixels PX may sense light in a specific spectrum region from light received through the microlens. For example, pixel array 11 may include a red pixel for converting light in the red spectral region into an electrical signal, a green pixel for converting light in the green spectral region into an electrical signal, and a blue pixel for converting light in the blue spectrum region into an electrical signal. A color filter for transmitting light in a specific spectral region may be disposed on each of the plurality of pixels PX, but some example embodiments thereof is not limited thereto.

In some example embodiments, a plurality of pixels PX may have a multilayer structure. The pixel PX having a multilayer structure may include a plurality of stacked photoelectric conversion devices configured to convert light in different spectral regions into electrical signals, and electrical signals corresponding to different colors may be generated by the plurality of photoelectric conversion devices. That is, electrical signals corresponding to a plurality of colors may be output by the pixel PX.

A color filter array for transmitting light of a specific spectral region may be disposed above the plurality of pixels PX. The color sensed by the corresponding pixel may be determined depending on the color filter disposed on each of the plurality of pixels PX, but some example embodiments thereof are not limited thereto, and in some example embodiments, in the case of a specific photoelectric conversion device, light in a specific wavelength band may be converted into an electrical signal depending on the level of the electrical signal applied to the photoelectric conversion device. In some example embodiments, the pixel PX may have a split photodiode structure including at least two photodiodes configured to be exposed to one or more bursts of light from a light source.

Each of the plurality of column lines CL may extend in a column direction and may be connected to a pixel PX disposed in the same column. Each of the plurality of column lines CL may be a row unit of the pixel array 11 and may transmit a reset signal and a sensing signal of the pixels PX to the readout circuit 13.

The timing controller 15 may control timing of the row driver 12, the readout circuit 13, and the ramp signal generator 14. The timing controller 15 may provide timing signals indicating operation timing to each of the row driver 12, the readout circuit 13, and the ramp signal generator 14.

The row driver 12 may generate control signals for driving the pixel array 11 under control of the timing controller 15, and may provide control signals to each of a plurality of pixels PX of the pixel array 11 through the plurality of row lines RL. The row driver 12 may control the plurality of pixels PX of the pixel array 11 to sense incident light simultaneously or in a row unit. Also, the row driver 12 may select the pixels PX as a row unit among the plurality of pixels PX, and may control the selected pixel PX (e.g., pixels PX of one row) to output reset signals and sensing signals through the plurality of column lines CL.

The row driver 12 may transmit control signals for outputting pixel signals to the pixel array 11. The pixel PX may output pixel signals by operating in response to the control signals. Here, the pixel signal may include a sensing signal and a reset signal. In some example embodiments, the row driver 12 may generate control signals for controlling the pixel PX to operate high conversion gain mode and low conversion gain mode with respect to a large photodiode (LPD) and to operate high conversion gain mode and low conversion gain mode with respect to a small photodiode (SPD) consecutively in the readout period, and may provide the signals to the pixel array 11.

The ramp signal generator 14 may generate a ramp signal RAMP increasing or decreasing with a predetermined slope and may provide the ramp signal RAMP to the ADC circuit 13*a* of the readout circuit 13. The readout circuit 13 may read out a reset signal and a sensing signal from the pixels PX of a row selected by the row driver 12 among the plurality of pixels PX. The readout circuit 13 may convert reset signals and sensing signals received from the pixel array 11 through the plurality of column lines CL into digital data based on the ramp signal RAMP from the ramp signal generator 14, thereby generating pixel values corresponding to the plurality of pixels PX as a row unit and may outputting the values.

The ADC circuit 13*a* may include a plurality of ADCs corresponding to the plurality of column lines CL, and each of the plurality of ADCs may compare a reset signal and a sensing signal received through a corresponding column line CL with a ramp signal RAMP and may generate pixel values based on the comparison results. For example, the ADC may remove the reset signal from the sensing signal and may generate a pixel value indicating the amount of light sensed by the pixel PX.

The plurality of pixel values generated by the ADC circuit 13*a* may be output as image data IDT through the data bus 13*b*. For example, the image data IDT may be provided to the image signal processor 19 provided in or outside the image sensor 10.

The data bus 13*b* may temporarily store and may output the pixel value output by the ADC circuit 13*a*. The data bus 13*b* may include a plurality of column memories and column decoders. A plurality of pixel values stored in the plurality of column memories may be output as image data IDTs under control of a column decoder.

The ADC circuit 13*a* may include a plurality of CDS circuits (not illustrated) and a plurality of counter circuits (not illustrated). The ADC circuit 13*a* may convert a pixel signal (e.g., pixel voltage) input from the pixel array 11 into a pixel value, which is a digital signal. Each pixel signal received through each of the plurality of column lines CL may be converted into a pixel value, which is a digital signal, by a CDS circuit and a counter circuit.

The CDS circuit may compare a pixel signal received through the column line CL with a ramp signal RAMP and may output the comparison result. The CDS circuit may output a comparison signal transitioning from a first level (e.g., logic high) to a second level (e.g., logic low) when the level of the ramp signal RAMP and the level of the pixel signal are the same. A time point at which the level of the comparison signal transitions may be determined depending on the level of the pixel signal. The CDS circuit may sample and hold the pixel signal provided from the pixel PX depending on a correlated double sampling (CDS) method, and may generate a comparison signal based on the level corresponding to the difference obtained by double-sampling the level of a specific noise level (e.g., reset signal) and the level according to the image signal (a sensing signal). In some example embodiments, the CDS circuit may include one or more comparators. The comparator may be implemented as, for example, an operational transconductance amplifier (OTA) (or a differential amplifier). The ADC circuit 13*a* may include a plurality of delta reset sampling (DRS) circuits (not illustrated). The DRS circuit may sample a pixel signal provided by reading out the pixel signal and reading out the reset signal according to the delta reset sampling (DRS) method.

The image signal processor 19 may perform noise reduction processing, gain adjustment, waveform shaping processing, interpolation processing, white balance processing, gamma processing, edge enhancement processing, binning, and the like, on image data.

Figure 2:
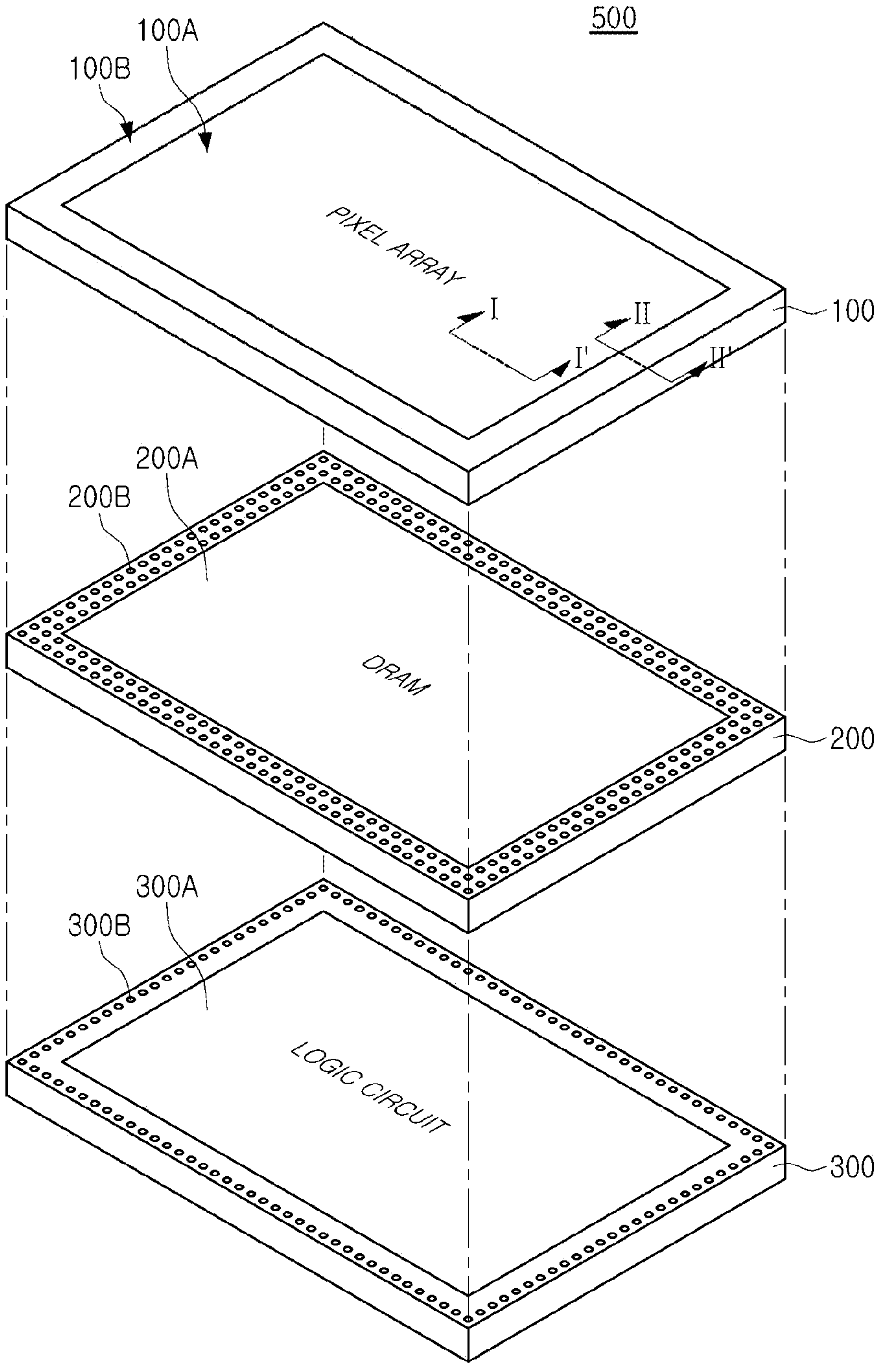
FIG. 2 is an exploded perspective diagram illustrating an image sensor according to some example embodiments of the present inventive concepts.
Figure 3:
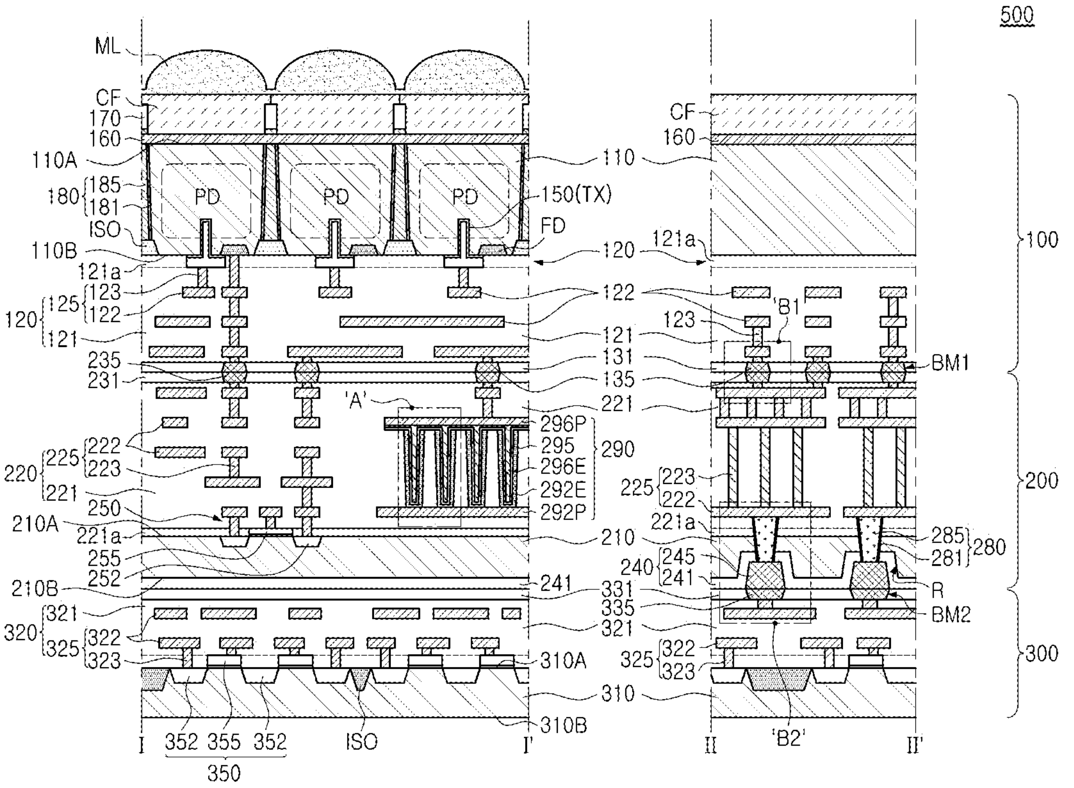
FIG. 3 is a cross-sectional diagram illustrating a pixel (or main) region and a peripheral region of an image sensor according to some example embodiments of the present inventive concepts.

FIG. 2 is an exploded perspective diagram illustrating an image sensor according to some example embodiments. FIG. 3 is a cross-sectional diagram illustrating a pixel (or main) region and a peripheral region of an image sensor according to some example embodiments.

Referring to FIG. 2, an image sensor 500 according to some example embodiments may include a first semiconductor chip 100, a second semiconductor chip 200, and a third semiconductor chip 300 configured to be stacked. The first semiconductor chip 100, the second semiconductor chip 200, and the third semiconductor chip 300 may include main regions 100A, 200A, and 300A (also referred to herein as first regions), and peripheral regions 100B, 200B, and 300B (also referred to herein as second regions) surrounding the main regions 100A, 200A, and 300A, respectively.

For example, the main region 100A of the first semiconductor chip 100 may include a pixel array (see "11" in FIG. 1) in which a photoelectric conversion device PD and a pixel circuit are arranged, and may also be referred to as a "pixel region." The main regions of the second semiconductor chip and the third semiconductor chip may overlap the pixel region, and may be referred to "pixel regions" in a broad sense in some example embodiments.

In some example embodiments, the main region 200A of the second semiconductor chip 200 may include a memory including a capacitor. Also, the main region 300A of the third semiconductor chip 300 may include a logic circuit (see "12" to "15" in FIG. 1) including a row driver, a readout circuit, a ramp signal generator and a timing controller. Peripheral circuits (e.g., input/output circuits) connected to circuits in the main regions 100A, 200A, and 300A may be disposed in the peripheral regions 100B, 200B, and 300B of the first semiconductor chip 100, the second semiconductor chip 200, and the third semiconductor chip 300, respectively.

In some example embodiments, the first semiconductor chip 100 and the second semiconductor chip 200 may be bonded to each other by the first bonding pad 135 and the second upper bonding pad 235, and the second semiconductor chip 200 and the third semiconductor chip 300 may be bonded to each other by the second lower bonding pad 245 and the third bonding pad 335. The bonding structure will be described in greater detail with reference to FIGS. 5A and 5B.

Referring to FIG. 2 together with FIG. 3, the first to third semiconductor chips 100, 200, and 300 may include first to third semiconductor substrates 110, 210, and 310 and first to third wiring structures 120, 220, and 320, respectively. In FIG. 3, the pixel region may be a cross-section taken along line I-I' in FIG. 2, and the peripheral region may be a cross-section taken along line II-II' in FIG. 2.

Specifically, the first semiconductor chip 100 may include a first semiconductor substrate 110 having a pixel array (11 in FIG. 1, sometimes referred to herein as a pixel unit) in which a plurality of pixels PX are arranged, and a first wiring structure 120 disposed on (e.g., under, beneath, etc.) the first semiconductor substrate 110. The first semiconductor chip 100 may also be referred to as a "pixel array chip."

The first semiconductor substrate 110 may be implemented as a silicon substrate or a semiconductor substrate such as silicon germanium. Here, an upper surface 110A of the first semiconductor substrate 110 may be referred to as a back side, and a lower surface 110B of the first semiconductor substrate 110 may be referred to as a front side.

The first semiconductor substrate 110 may include a photoelectric conversion device PD and a pixel separation structure 180. The photoelectric conversion device employed in some example embodiments may have a photodiode structure (for example, may be a photodiode). An upper surface 110A of the first semiconductor substrate 110 may be configured as a light receiving surface to which light is incident.

The pixel separation structure 180 may be disposed between the plurality of pixels PX arranged in matrix form and may define the plurality of pixels PX. In some example embodiments, the pixel separation structure 180 may physically and electrically separate the photodiode PDs from each other. The pixel separation structure 180 may have a front deep trench isolation (FDTI) structure penetrating the first semiconductor substrate 110 from a lower surface 110B (or front side) to an upper surface 110A (or back side) of the first semiconductor substrate 110. A deep trench for the pixel separation structure 180 may be formed in the first semiconductor substrate 110, and the pixel separation structure 180 may include an insulating film 181 conformally formed on an internal surface of the trench and a conductive layer 185 filling the trench on the insulating film 181. For example, the insulating film 181 may include at least one of silicon oxide, silicon nitride, silicon oxynitride, hafnium oxide, aluminum oxide, and tantalum oxide. The conductive layer 185 may include at least one of doped polysilicon, metal, metal silicide, metal nitride, and a metal-containing film.

The first semiconductor device 150 may be disposed on (e.g., under, beneath, etc.) the lower surface 110B of the first semiconductor substrate 110. The device isolation pattern ISO may define an active region in the first semiconductor substrate 110 in which the first semiconductor device 150 is formed. The device isolation pattern ISO may be formed, for example, by filling an insulating material in a shallow trench formed by patterning the first semiconductor substrate 110. The first semiconductor device 150 may include a portion (e.g., a transfer transistor or a floating diffusion node) among devices included in the pixel circuit (see FIG. 6 or FIG. 7).

The first wiring structure 120 disposed on the lower surface 110B of the first semiconductor substrate 110 may include a first insulating layer 121 and a first wiring layer 125 disposed in the first insulating layer 121. The first wiring layer 125 may be connected to the first semiconductor devices 150. A first interlayer insulating film 121*a* surrounding the first semiconductor devices 150 may be disposed on a lower surface 110B of the first semiconductor substrate 110. The first wiring layer 125 may include a plurality of first wiring lines 122 disposed on a plurality of levels in the first insulating layer 121 and first wiring vias 123 connected to the plurality of first wiring lines 122. For example, the first wiring layer 125 may include copper or a copper alloy. As referred to herein, a "level" may refer to a distance from a reference location (e.g., an upper surface 110A of the first semiconductor substrate 110) in a vertical direction, for example a direction extending perpendicular to the upper surface 110A of the first semiconductor substrate 110.

The second semiconductor chip 200 may be disposed on (e.g., under, beneath, etc.) the first semiconductor chip 100 (a lower surface of the first semiconductor chip) to face the first wiring structure 120. The second semiconductor chip 200 may include a second semiconductor substrate 210 and a second wiring structure 220 disposed on (e.g., above) an upper surface 210A of the second semiconductor substrate 210 and having a capacitor structure 290. The second semiconductor chip 200 may also be referred to as a "memory chip" such as a DRAM chip.

The second semiconductor substrate 210 may be a silicon substrate or a semiconductor substrate such as silicon germanium. Here, the upper surface 210A of the second semiconductor substrate 210 may be referred to as a front side or a first surface, and the lower surface 210B of the second semiconductor substrate 210 may be referred to as a back side or a second surface that is opposite to the upper surface 210A. The second semiconductor devices 250 may be disposed on the upper surface 210A of the second semiconductor substrate 210 and may include another portion of devices included in a pixel circuit (see FIG. 6 or FIG. 7).

The second wiring structure 220 disposed on (e.g., above) the upper surface 210A of the second semiconductor substrate 210 may include a second insulating layer 221 and a second wiring layer 225 disposed in the second insulating layer 221. The second wiring layer 225 may be connected to the second semiconductor devices 250. A second interlayer insulating film 221*a* surrounding the second semiconductor devices 250 may be disposed on an upper surface 210A of the second semiconductor substrate 210. The second wiring layer 225 may include a plurality of second wiring lines 222 disposed on a plurality of levels in the second insulating layer 221 and second wiring vias 223 connected to the plurality of second wiring lines 222. For example, the second wiring layer 225 may include copper or a copper alloy.

The second wiring structure 220 employed in some example embodiments may include a capacitor structure 290 connected to the second wiring layer 225. The capacitor structure 290 employed in some example embodiments may include an array of capacitors having a cylindrical shape.

Figure 4:
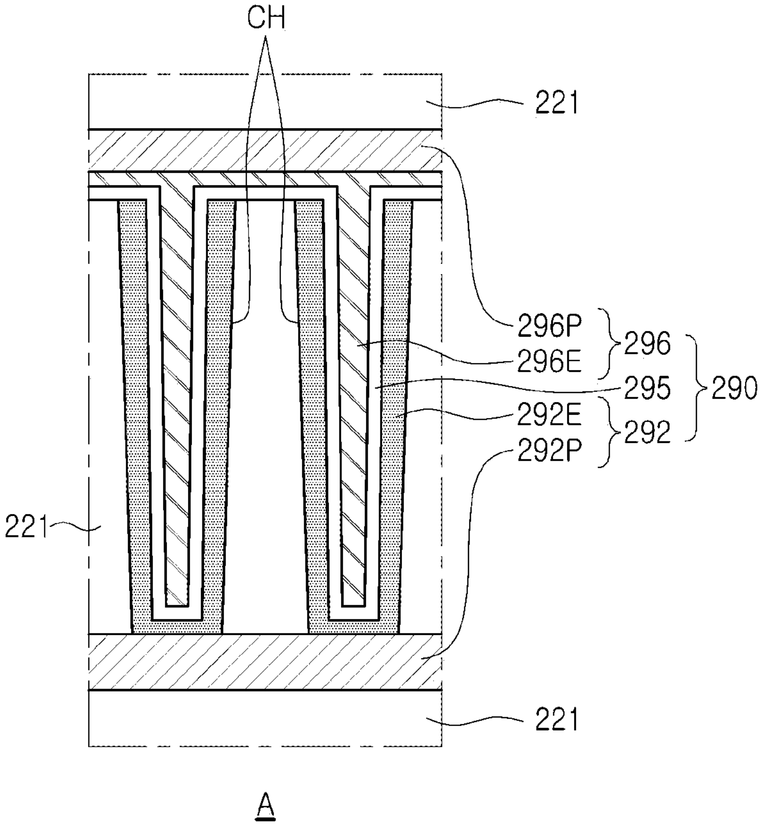
FIG. 4 is an enlarged diagram illustrating a capacitor structure of the image sensor illustrated in FIG. 3.

FIG. 4 is an enlarged diagram illustrating a capacitor structure of the image sensor illustrated in FIG. 3.

Referring to FIG. 4, a capacitor structure 290 may include a first electrode 292 and a second electrode 296 and a dielectric film 295 disposed therebetween. The first and second electrodes 292 and 296 may include first and second electrode pads 292P and 296P and first and second electrode layers 292E and 296E, respectively. The first and second electrode pads 292P and 296P may be connected to the second wiring layer 225.

A plurality of capacitor holes CH connected to the first electrode pad 292P may be formed in the second insulating layer 221, and the plurality of first electrode layers 292E may be formed in a cylindrical shape in each of the plurality of capacitor holes CH. The dielectric film 295 may conformally cover upper surfaces and sidewalls of each of the plurality of first electrode layers 292E, and the second electrode layer 296E may cover the dielectric film 295. The second electrode pad 296P may be disposed in a flat plate shape on the upper surface of the second electrode layer 296E.

For example, the first electrode layer 292E and the second electrode layer 296E may include at least one of a high melting point metal film such as cobalt, titanium, nickel, tungsten and molybdenum, a metal nitride film such as titanium nitride (TiN), titanium silicon nitride (TiSiN), titanium aluminum nitride (TiAlN), tantalum nitride (TaN), tantalum silicon nitride (TaSiN)), a tantalum aluminum nitride (TaAlN) and a tungsten nitride (WN), and combinations thereof, but some example embodiments thereof is not limited thereto. At least one of the first and second electrode layers 292E and 296E may include a metal material different from that of the second wiring layer 225. In some example embodiments, at least one of the first and second electrode layers 292E and 296E may include tungsten, and the second wiring layer 225 may include copper.

The dielectric film 295 may include, for example, at least one of a metal oxide such as $HfO_2$, $ZrO_2$, $Al_2O_3$, $La_2O_3$, $Ta_2O_3$ and $TiO_2$, a perovskite dielectric material such as $SrTiO_3$(STO), (Ba,Sr)$TiO_3$(BST), $BaTiO_3$, PZT, and PLZT, and combinations thereof. The dielectric film 295 may be a single film or a multi-film. The second electrode pad 296P may include, for example, at least one of semiconductor materials such as impurity-doped polysilicon and silicon germanium, metals such as tungsten, copper, aluminum, titanium and tantalum, and combinations thereof. However, some example embodiments thereof are not limited thereto. In some example embodiments, the second electrode pad 296P may include a material different from that of the second electrode layer 296E.

In the image sensor 500 according to some example embodiments, instead of directly forming a capacitor structure such as a DRAM on the first semiconductor chip 100 having a pixel array, by forming a capacitor structure 290 in a second semiconductor chip 200 (in particular, in the second wiring structure 220) and bonding the second semiconductor chip 200 that includes the capacitor structure 290 with the first semiconductor chip 100, contamination of pixels may be reduced, minimized, or prevented in the process of forming an electrode of the capacitor structure 290, thereby reducing, minimizing, or preventing manufacturing defects in the image sensor 500 and thereby improving yield of image sensors 500 in the manufacturing process and improving reliability of manufactured image sensors 500 and devices including same.

Also, in some example embodiments, the first and second semiconductor chips 100 and 200 may be bonded to each other by a bonding structure (also referred to as a "first bonding structure BS1 (see FIGS. 10A to 11)") indicated as "B1."

Figure 5A:
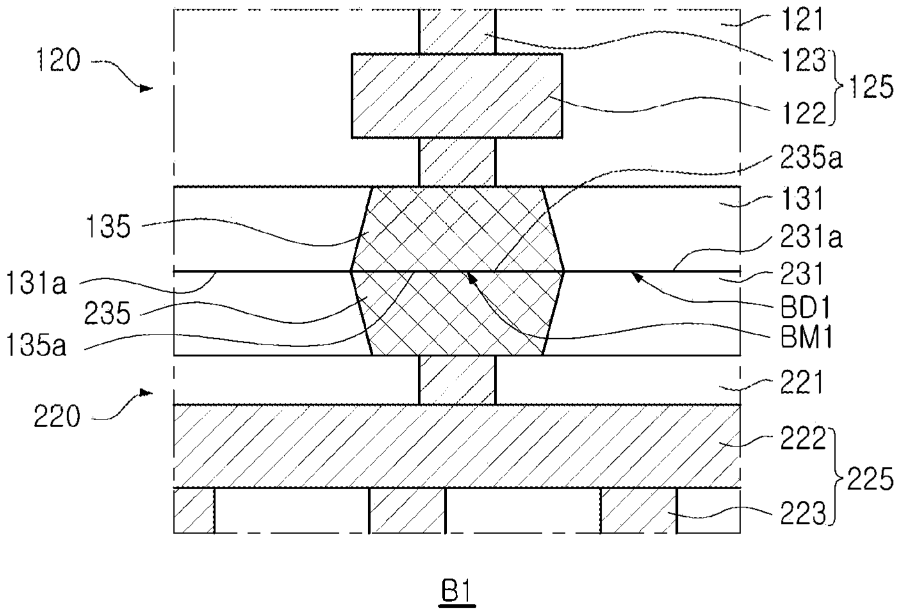
FIGS. 5A and 5B are enlarged diagrams illustrating first and second bonding portions of the image sensor illustrated in FIG. 3, respectively.
Figure 5B:
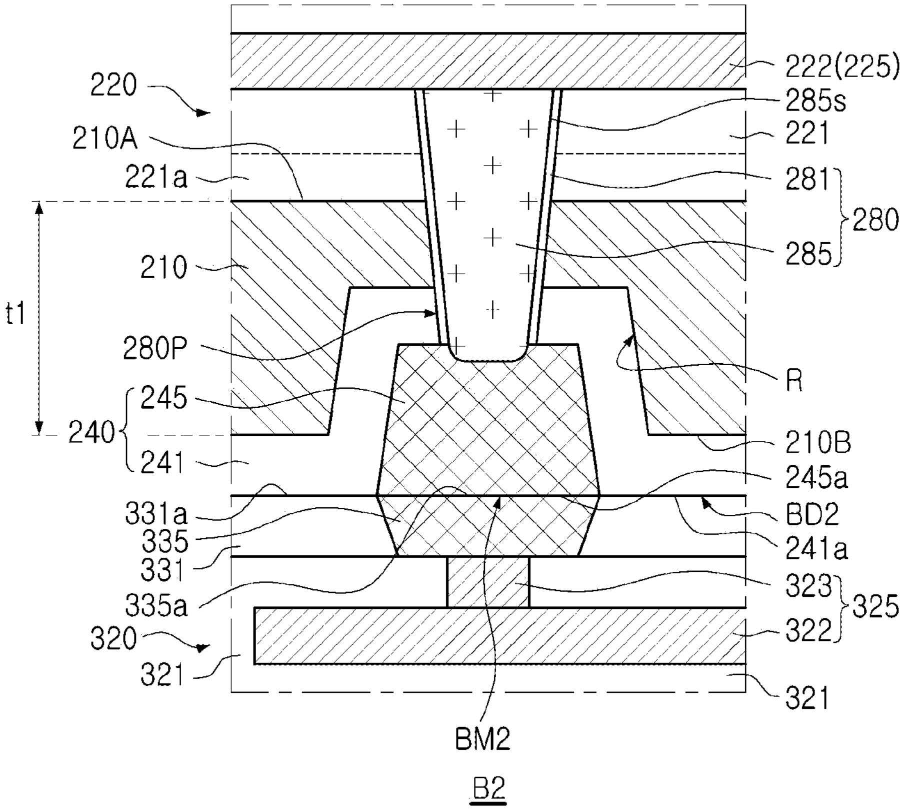

FIGS. 5A and 5B are enlarged diagrams illustrating first and second bonding portions of the image sensor illustrated in FIG. 3, respectively.

Referring to FIG. 5A, the first wiring structure 120 may include a first bonding insulating film 131, which is a lowermost layer of the first wiring structure 120, and a first bonding pad 135 embedded in the first bonding insulating film 131 and connected to the first wiring layer 125. Similarly, the second wiring structure 220 may include a second bonding insulating film 231 which is an uppermost layer of the second wiring structure 220 and a second upper bonding pad 235 disposed in the second bonding insulating film 231. The first bonding pad 135 may have a surface 135*a* exposed to one surface of the first wiring structure 120 (e.g., a lower surface 131*a* of the first bonding insulating film 131), and the surface 135*a* may be coplanar or substantially coplanar with a lower surface 131*a* of the first bonding insulating film 131. Similarly, the second upper bonding pad 235 may have a surface (e.g., upper surface 235*a*) that is coplanar or substantially coplanar with the upper surface 231*a* of the second bonding insulating film 231.

The directly bonded first bonding pad 135 and the second upper bonding pad 235 may be bonded to each other by mutual diffusion between metals (e.g., copper) through a high-temperature annealing process. The metal included in the first bonding pad 135 and the second upper bonding pad 235 is not limited to copper, and may include other metal materials (e.g., Au) for bonding under similar conditions. The intermetallic bonding BM1 between the pads may guarantee electrical connection with solid bonding. The upper surface 231*a* of the second bonding insulating film 231 may be a surface of the second wiring structure 220 that is in contact with a surface of the first wiring structure that exposes the first bonding pad 135 (e.g., the lower surface 131*a* of the first bonding insulating film 131), and the upper surface 235*a* of the second upper bonding pad 235 may be exposed to the one surface of the second wiring structure (e.g., the upper surface 231*a* of the second bonding insulating film 231) and may be bonded to the first bonding pad 135.

The first and second bonding insulating films 131 and 231 may include the same dielectric material, for example, silicon oxide. In some example embodiments, the first and second bonding insulating films 131 and 231 may include an insulating material different from that of the first and second insulating layers 121 and 221 or may further include an insulating film of other materials. For example, these other materials may include other insulating films such as SiCN, SiON or SiCO.

The first bonding pad 135 and the second upper bonding pad 235 may form intermetallic bonding BM1. Also, the first and second bonding insulating films 131 and 231 may form dielectric-dielectric bonding BD1. This bonding may also be referred to as "hybrid bonding."

The first wiring layer 125 and the second wiring layer 225 may be electrically connected to each other by the intermetallic bonding BM1 between the first bonding pad 135 and the second upper bonding pad 235. The first bonding pad 135 and second upper bonding pad 235 may be aligned in the peripheral region 100B and 200B, and may also be aligned in the main region 100A and 200A overlapping the pixel region, thereby electrically/mechanically connecting the first and second semiconductor chips 100 and 200 to each other throughout the entire region.

In the pixel region 100A and the main region 200A overlapping the pixel region 100A (e.g., overlapping the pixel region 100A in a vertical direction extending perpendicular to the upper surface 110A of the first semiconductor substrate 110), the first semiconductor devices 150 of the first semiconductor chip 100 and the second semiconductor devices 250 of the second semiconductor chip 200 may be included in the pixel circuit through the first and second wiring structures 120 and 220 connected to each other by the first bonding pad 135 and the second upper bonding pad 235. The pixel circuit may include a transfer transistor, a driver transistor, a select transistor, and a reset transistor in each unit pixel, and may be implemented in various types of circuits. In some example embodiments, pixels adjacent to each other may share a floating diffusion node, and a portion of transistors (e.g., a driver transistor, a select transistor, and/or a reset transistor) may be shared.

Figure 6:
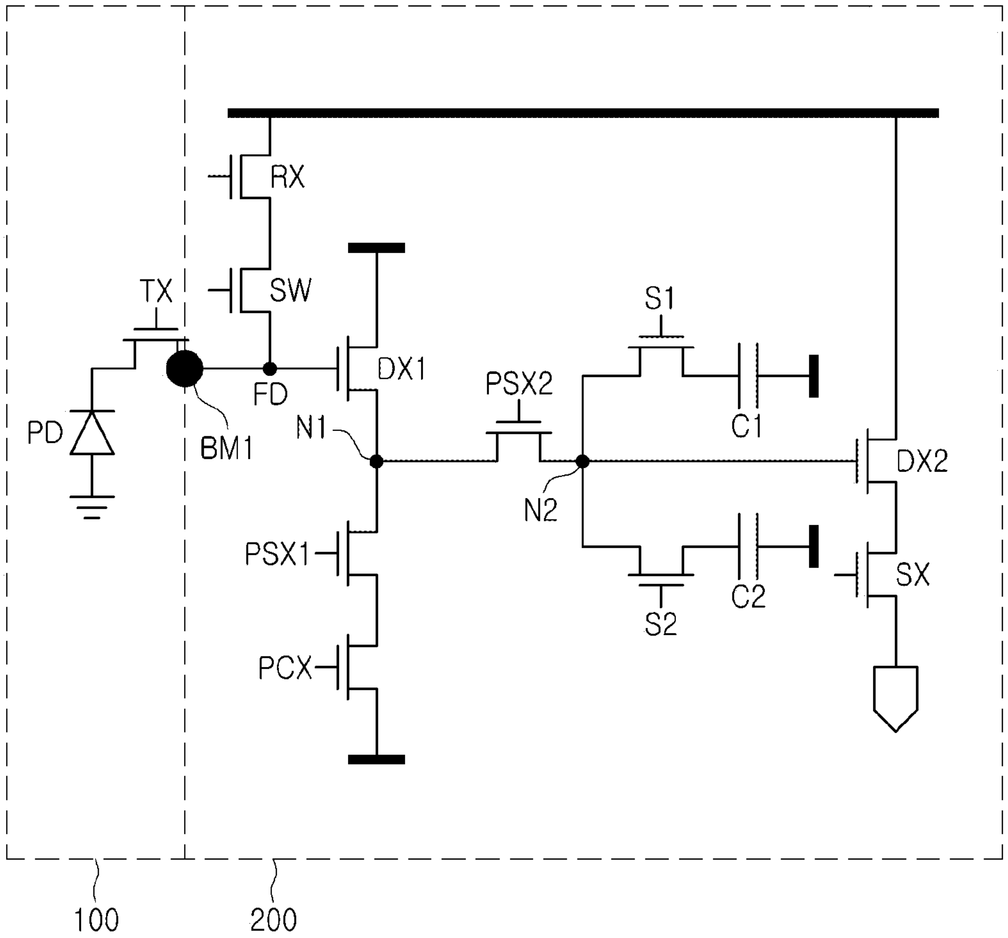
FIG. 6 is a circuit diagram illustrating an example of a pixel employable in an image sensor according to some example embodiments of the present inventive concepts.
Figure 7:
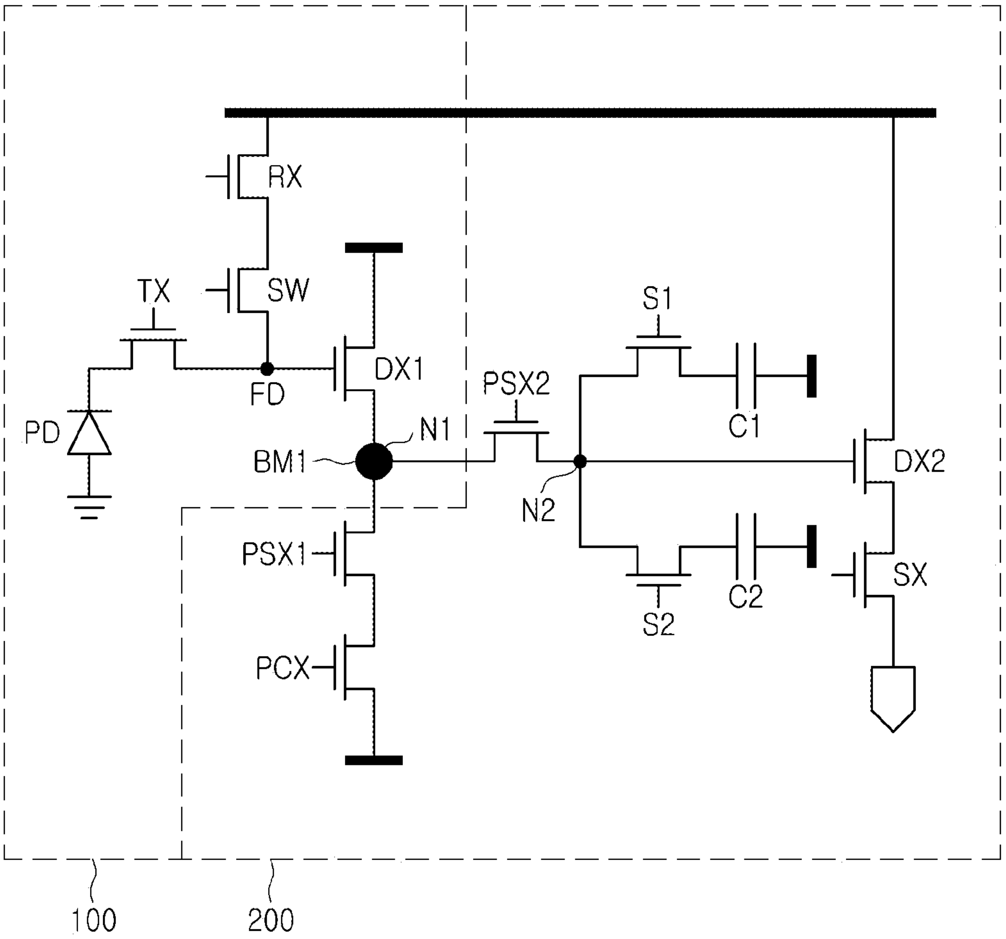
FIG. 7 is a circuit diagram illustrating an example of a pixel employable in another image sensor according to some example embodiments of the present inventive concepts.

FIG. 6 is a circuit diagram illustrating an example of a pixel employable in an image sensor according to some example embodiments of the present inventive concepts. FIG. 7 is a circuit diagram illustrating an example of a pixel employable in another image sensor according to some example embodiments of the present inventive concepts.

As illustrated in FIGS. 6 and 7, a pixel circuit which may be employed in the image sensor 500 according to some example embodiments may be a circuit including a plurality of transistors for implementing a global shutter operation.

Control signals may be applied to the pixel circuit illustrated in FIG. 6, and at least a portion of the control signals may be generated by the row driver 12. The photodiode PD may generate photoelectric charges varying depending on intensity of light. For example, the photodiode PD may generate electric charge, that is, electrons with negative charge and holes with positive charge, in proportion to the amount of incident light.

The pixel circuit may include a plurality of transistors TX, RX, DX1, PSX1, PSX2, PCX, S1, S2, DX2, and SX, a first capacitor C1 and a second capacitor C2. Electric charges according to a reset operation or electric charges according to a photoelectric charge accumulation operation may be accumulated in the first capacitor C1 and the second capacitor C2.

The pixel circuit may include a transfer transistor TX. The transfer transistor TX may be connected between the photodiode PD and the floating diffusion node FD. The first terminal of the transfer transistor TX may be connected to an output end of the photodiode PD, and the second terminal of the transfer transistor TX may be connected to the floating diffusion node FD. The transfer transistor TX may be turned on or off in response to the transmission control signal received from the row driver 12, and may transfer photoelectric charges generated by the photodiode PD to the floating diffusion node FD.

The pixel circuit may include a reset transistor RX. The reset transistor RX may reset electric charge accumulated in the floating diffusion node FD. The first terminal of the reset transistor RX may be applied with a second pixel voltage, and the second terminal of the reset transistor RX may be connected to the floating diffusion node FD. The reset transistor RX may be turned on or turned off in response to a reset control signal received from the row driver 12, and electric charges accumulated in the floating diffusion node FD may be discharged such that the floating diffusion node FD may be reset.

The pixel signal generator circuit may include a first driver transistor DX1. The first pixel voltage may be applied to the first terminal of the first driver transistor DX1, and the second terminal of the first driver transistor DX1 may be connected to the first output node N1. The first driver transistor DX1 may be implemented as a buffer amplifier and may buffer a signal according to the amount of charge charged in the floating diffusion node FD. A potential of the floating diffusion node FD may change according to the amount of charge accumulated in the floating diffusion node FD, and the first driver transistor DX1 may amplify the potential change in the floating diffusion node FD and may output the amplified potential change to the first output node N1.

The pixel circuit may include a precharge select transistor PSX1 for resetting the first output node N1. For example, the pixel circuit may include a first precharge select transistor. A first terminal of the first precharge select transistor PSX1 may be connected to the first output node N1, and a second terminal of the first precharge select transistor PSX1 may be connected to the precharge transistor PCX. Here, the connection between the first driver transistor DX1 and the first precharge select transistor PSX1 or the connection between the first driver transistor DX1 and the transfer transistor TX may be implemented by intermetallic bonding BM1 between the first bonding pad 135 and second upper bonding pad 235 described with reference to FIGS. 3 and 5A.

The first precharge select transistor PSX1 may be turned on or off in response to the first precharge select control signal received from the row driver 12 and may reset the first output node N1. In some example embodiments, the pixel circuit may include a plurality of precharge select transistors for resetting the first output node N1. For example, the pixel circuit may further include a second precharge select transistor PSX2 in addition to the first precharge select transistor PSX1 as illustrated in FIG. 6. The first terminal of second precharge select transistor PSX2 may be connected to a first output node N1, and the second terminal of second precharge select transistor PSX2 may be connected to a second output node N2. The second precharge select transistor PSX2 may be turned on or off in response to the second precharge select control signal received from the row driver 12, and may reset the first output node N1 and the second output node N2.

The pixel circuit may include a precharge transistor PCX. The first terminal of the precharge transistor PCX may be connected to the first precharge select transistor PSX1, and a ground voltage may be applied to the second terminal of the precharge transistor PCX. The precharge transistor PCX may operate as a current source according to the precharge control signal received from the row driver 12 and may precharge the first output node N1. The pixel circuit may include a first sampling transistor S1. A first terminal of the first sampling transistor S1 may be connected to a second output node N2, and a second terminal of the first sampling transistor S1 may be connected to a first capacitor C1. The first sampling transistor S1 may be turned on or off in response to the first sampling control signal received from the row driver 12, and may connect the first capacitor C1 to the second output node N2. A ground voltage may be applied to a first terminal of the first capacitor C1, and a second terminal of the first capacitor C1 may be connected to the first sampling transistor S1. Electric charges may be accumulated in the first capacitor C1 according to the switching operation of the first sampling transistor S1. For example, electric charges may be accumulated in the first capacitor C1 according to a reset operation in which the floating diffusion node FD is reset. A ground voltage may be applied to the first capacitor C1, but in some example embodiments, a first pixel voltage may be applied to the first capacitor C1.

The pixel circuit may include a second sampling transistor S2. A first terminal of the second sampling transistor S2 may be connected to a second output node N2, and a second terminal of the second sampling transistor S2 may be connected to the second capacitor C2. The second sampling transistor S2 may be turned on or off in response to the second sampling control signal received from the row driver 12, and may connect the second capacitor C2 to the second output node N2. A ground voltage may be applied to a first terminal of the second capacitor C2, and a second terminal of the second capacitor C2 may be connected to the second sampling transistor S2. electric charges may be accumulated in the second capacitor C2 according to the switching operation of the second sampling transistor S2. For example, electric charges may be accumulated in the second capacitor C2 according to a photoelectric charge accumulation operation in which photoelectric charges generated by the photodiode PD are accumulated in the floating diffusion node FD. Similarly to the first capacitor C1, a ground voltage or a first pixel voltage may be applied to the second capacitor C2.

The pixel circuit may include a second driver transistor DX2 and a select transistor SX. A second pixel voltage may be applied to the first terminal of second driver transistor DX2, and the second terminal of the second driver transistor DX2 may be connected to a select transistor SX. The second driver transistor DX2 may amplify a potential change at the second output node N2 and may output the amplified potential change. In some example embodiments, the second pixel voltage applied to the second driver transistor DX2 may be less than or equal to the first pixel voltage.

A first terminal of the select transistor SX may be connected to the second driver transistor DX2, and a second terminal of the select transistor SX may be connected to a column line ("CL" in FIG. 1). The select transistor SX may be turned on or off in response to a select control signal received from the row driver 12. When the select transistor SX is turned on in a readout operation, a pixel signal including a reset signal corresponding to a reset operation or an image signal corresponding to an electric charge accumulation operation may be output to the column line CL. For example, when the first sampling transistor S1 is turned on and the second sampling transistor S2 is turned off while the select transistor SX is turned on, a reset signal corresponding to electric charge accumulated in the first capacitor C1 may be output. Also, when the second sampling transistor S2 is turned on and the first sampling transistor S1 is turned off while the select transistor SX is turned on, an image signal corresponding to the electric charge accumulated in the second capacitor C2 may be output.

The image sensor 500 according to some example embodiments may further output (e.g., transmit) an image signal. Specifically, after the first image signal corresponding to the electric charge accumulated in the second capacitor C2 is output by the above-described method, the second image signal corresponding to electric charge accumulated in the first capacitor C1 and the second capacitor C2 may be further output. For example, while the select transistor SX is turned on, both the first sampling transistor S1 and the second sampling transistor S2 may be turned on, and a second image signal corresponding to electric charge accumulated in first capacitor C1 and second capacitor C2 may be output. When both the first sampling transistor S1 and the second sampling transistor S2 are turned on, capacitance may be increased as the first capacitor C1 and second capacitor C2 are connected to each other in parallel. Accordingly, when compared to the first image signal, a voltage of the second image signal may decrease according to a decrease in the conversion gain.

In the image sensor 500 according to some example embodiments, a portion (e.g., a first portion) of the devices included in the above-described pixel circuit may be formed on the first semiconductor chip 100, the other portion of the devices included in the above-described pixel circuit (e.g., a separate portion excluding the first portion) may be formed on the second semiconductor chip 200, and devices of the first semiconductor chip 100 and devices of the second semiconductor chip 200 may be connected to each other by intermetallic bonding BM1 between the first bonding pad 135 and the second upper bonding pad 235 and the aforementioned pixel circuit may be formed.

The photodiode PD and the transfer transistor TX of the pixel circuit illustrated in FIG. 6 may be implemented in the first semiconductor chip 100, and the other transistors RX, DX1, PSX1, PSX2, PCX, S1, S2, DX2, and SX and first and second capacitors C1 and C2 may be implemented in the second semiconductor chip 200.

Specifically, referring to FIG. 6, in the image sensor 500 according to some example embodiments, the first semiconductor devices 150 formed on the lower surface of the first semiconductor substrate 110 may include a transfer transistor TX. The second semiconductor devices 250 formed on the upper surface of the second semiconductor substrate 210 may include other transistors RX, DX1, PSX1, PSX2, PCX, S1, S2, DX2, and SX other than the transfer transistor TX. Also, a floating diffusion node FD may be further formed on (e.g., above) the upper surface 210A of the second semiconductor substrate 210. Here, the first driver transistor DX1 and the transfer transistor TX may form a pixel circuit through the intermetallic bonding BM1 between the first bonding pad 135 and the second upper bonding pad 235 together with the first and second wiring layers 125 and 225.

Also, a floating diffusion node FD and a switching device SW may be formed on (e.g., above, over, etc.) the upper surface 210A of the second semiconductor substrate 210. Here, the transfer transistor TX and the floating diffusion node FD may be connected to each other by intermetallic bonding BM1 between the first bonding pad 135 and the second upper bonding pad 235 together with the first and second wiring layers 125 and 225 and may form the pixel circuit based on the intermetallic bonding BM1.

In some example embodiments, devices of the pixel circuit may be divided and disposed on the first and second semiconductor chips 100 and 200, differently from FIG. 6. For example, as illustrated in FIG. 7, devices of the same pixel circuit may be divided.

In the pixel circuit illustrated in FIG. 7, along with the photodiode PD the transfer transistor TX, the reset transistor RX, the first driver transistor DX1, and the switching device SW may be implemented in the first semiconductor chip 100, and the other transistors PSX1, PSX2, PCX, S1, S2, DX2, and SX and the capacitor C1 and C2 of the pixel circuit may be implemented in the second semiconductor chip 200.

Specifically, the first semiconductor devices 150 formed on (e.g., below, beneath, etc.) the lower surface 110B of the first semiconductor substrate 110 may include a transfer transistor TX, a reset transistor RX, and a first driver transistor DX1. Also, a floating diffusion node FD may be formed on the lower surface 110B of the first semiconductor substrate 110. The second semiconductor devices 250 formed on the upper surface 210A of the second semiconductor substrate 210 may include other transistors PSX1, PSX2, PCX, S1, S2, DX2, and SX. Here, the first driver transistor DX1 and the first precharge select transistor PSX1 may be connected to each other by intermetallic bonding BM1 between the first bonding pad 135 and the second upper bonding pad 235 together with the first and second wiring layers 125 and 225 and may form the pixel circuit.

The third semiconductor chip 300 may include a third semiconductor substrate 310 having an upper surface 310A on which logic devices (e.g., the third semiconductor devices 350) are disposed, and a third wiring structure 320 disposed on (e.g., above) the upper surface 310A of the third semiconductor substrate to face the lower surface 210B of the second semiconductor substrate 210. The third semiconductor chip 300 may also be referred to as a "logic chip."

The third semiconductor substrate 310 may be implemented as a silicon substrate or a semiconductor substrate such as silicon germanium. Here, an upper surface 310A of the third semiconductor substrate 310 may be referred to as a front side, and a lower surface 310B of the third semiconductor substrate 310 may be referred to as a back side.

Similarly to the first and second wiring structures 120 and 220, the third wiring structure 320 may include a third insulating layer 321 and a third wiring layer 325 disposed in the third insulating layer 321. The third wiring layer 325 may include a plurality of third wiring lines 322 and a third wiring vias 323.

The third semiconductor devices 350 formed in an active region defined by the device isolation pattern ISO may be formed on an upper surface of the third semiconductor substrate 310. The third semiconductor devices 350 may be included in various logic circuits, for example, a row driver 12, a readout circuit 13, a ramp signal generator 14 and a timing controller 15. The third semiconductor devices 350 may include a gate electrode 355 and source/drain regions 352 doped with impurities on both sides of the gate electrode 355.

In some example embodiments, the second and third semiconductor chips 200 and 300 may be bonded to each other by a bonding structure (also referred to as a "second bonding structure BS2 (see FIGS. 10A to 11)") indicated by "B2."

Referring to FIG. 5B, a second semiconductor chip 200 may include a via structure 280 connected to the second wiring layer 225, penetrating through the second semiconductor substrate 210, and extending to a lower surface 210B (or a second surface) of the second semiconductor substrate 210.

The via structure 280 may be formed through a portion of the second insulating layer 221 and the second semiconductor substrate 210. For example, the via structure 280 may have a width decreasing toward the second lower bonding pad 245. The via structure 280 may include a via plug 285 and an insulating liner 281 surrounding a side surface 285*s* of the via plug 285. For example, the via plug 285 may include tungsten (W) or copper (Cu), and the insulating liner 281 may include $SiO_2$, SiN, SiCN, SiC, SiCOH, SiON, $Al_2O_3$, or AlN.

The second semiconductor chip 200 may include a bonding layer 240 disposed on the lower surface of the second semiconductor substrate 210 and to be bonded with the third semiconductor chip 300. The bonding layer 240 may include a bonding insulating layer 241 disposed on a lower surface of the second semiconductor substrate 210 and a second lower bonding pad 245 buried in the bonding insulating layer 241 and exposed to one surface of the bonding insulating layer 241.

In some example embodiments, the second semiconductor substrate 210 may have a recessed portion R on the lower surface 210B (e.g., the second semiconductor substrate 210 may have one or more inner surfaces that define a recessed portion R on the lower surface 210B, where the recessed portion R may extend towards the upper surface 210A of the second semiconductor substrate 210), and the via structure 280 may penetrate through the recessed portion R of the second semiconductor substrate 210. In some example embodiments, the via structure 280 may have a protruding portion 280P protruding from the bottom surface of the recessed portion R. The protruding portion 280P may have a via plug 285 portion exposed by removing the insulating liner 281 portion. A partial region of the second lower bonding pad 245 may be disposed in the recessed portion R and may be connected to the protruding portion 280P of the via structure 280. As such, the second lower bonding pad 245 may be connected to the second wiring layer 225 through the via structure 280.

The bonding insulating layer 241 may be disposed on the lower surface 210B of the second semiconductor substrate 210 and may extend to the surface of the recessed portion R. The bonding insulating layer 241 may electrically insulate the second lower bonding pad 245 from the second semiconductor substrate 210. The second lower bonding pad 245 may be understood to be buried or at least partially buried in the bonding insulating layer 241. As shown, a lower surface 245*a* of the second lower bonding pad 245 may be exposed to a lower surface 241*a* of the bonding insulating layer 241. An exposed region of the second lower bonding pad 245 may have a surface (e.g., the lower surface 245*a*) that is coplanar or substantially coplanar with the one surface (e.g., the lower surface 241*a*) of the bonding insulating layer 241.

In some example embodiments, the via structure 280 may penetrate at least a portion of the second semiconductor substrate 210, and a second lower bonding pad 245 connected to the second wiring layer 225 through the via structure 280 may be disposed. Accordingly, a thickness t1 of the second semiconductor substrate 210 may be stably maintained, such that the thickness t1 of the second semiconductor substrate 210 may be maintained to be at least a certain thickness. For example, the thickness t1 of the second semiconductor substrate 210 may be greater than or equal to 1.5 μm. In some example embodiments, the thickness t1 of the second semiconductor substrate 210 (e.g., in the vertical direction extending perpendicular to the upper surface 110A of the first semiconductor substrate 110) may be in the range of 2 μm to 5 μm. Based on maintaining the thickness t1 of the second semiconductor substrate 210 to have at least a certain value based on including the via structure 280 and the second lower bonding pad 245 to enable bonding with the third semiconductor chip 300, the probability of manufacturing defects due to excessively small thickness of the second semiconductor substrate 210 may be reduced, minimized, or prevented, and the ability of the second semiconductor chip 200 to accommodate one or more logic devices, analog devices, or the like thereon (e.g., to at least partially accommodate one or more transistors that collectively define a pixel circuit together with one or more devices, transistors, or the like of the first semiconductor chip 100) may be improved based on the stably maintained thickness of the second semiconductor chip 200. As a result, the reliability of the image sensor 500 to provide a three-stack structure having reliable bonding between the respective semiconductor chips thereof while also ensuring sufficient thickness of the second semiconductor chip to accommodate devices thereon/therein may be improved.

The third wiring structure 320 may include a third bonding insulating film 331 which is an uppermost layer of the third wiring structure 320 and a third bonding pad 335 disposed in the third bonding insulating film 331. The third bonding pad 335 may be buried in the third bonding insulating film 331, and an exposed region of the third bonding pad 335 may have a surface (e.g., the upper surface 335*a*) that is coplanar or substantially coplanar with one surface (e.g., the upper surface 331*a*) of the third bonding insulating film 331.

The second lower bonding pad 245 and the third bonding pad 335 directly bonded to each other may be bonded to each other by interactive diffusion between metals (e.g., copper) through a high-temperature annealing process. The metal included in the second lower bonding pad 245 and the third bonding pad 335 is not limited to copper, and may include other metal materials (e.g., Au) which may be bonded under similar conditions. The intermetallic bonding BM2 between the pads may guarantee electrical connection along with firm bonding.

The bonding insulating layer 241 and the third bonding insulating film 331 may include the same dielectric material, for example, silicon oxide. In some example embodiments, the third bonding insulating film 331 may include an insulating material different from that of the third insulating layer 321 or may further include an insulating film of other materials. For example, these other materials may include other insulating films such as SiCN, SiON or SiCO.

The second lower bonding pad 245 and the third bonding pad 335 may form intermetallic bonding BM2. Also, the bonding insulating layer 241 and the third bonding insulating film 331 may form dielectric-dielectric bonding BD2. This bonding may also be referred to as "hybrid bonding."

The second wiring layer 225 and the third wiring layer 325 may be electrically connected to each other by intermetallic bonding BM2 between the second lower bonding pad 245 and the third bonding pad 335. The second lower bonding pad 245 and the third bonding pad 335 may be aligned in the peripheral regions 200B and 300B and may electrically/mechanically connect the second and third semiconductor chips 200 and 300 to each other.

The image sensor 500 according to some example embodiments may include an insulating material layer 160 disposed on the upper surface 110A of the first semiconductor substrate 110 and having an anti-reflection film, a color filter CF disposed on the insulating material layer 160 and a microlens ML. The color filter CF may be disposed in each of a plurality of pixel regions defined by the insulating grid structure 170. The microlens ML may be disposed on the photoelectric conversion device PD, and may be configured to collect incident light from the outside and may allow light to be incident to the photoelectric conversion device PD. The color filter CF may selectively transmit an optical signal of a specific wavelength band.

The image sensor 500 according to some example embodiments may be mounted on an electronic device having an image or light sensing function. For example, the image sensor 500 may be mounted on a camera, a smart phone, wearable device, Internet of Things (IoT) device, home appliance, tablet personal computer (PC), personal digital assistant (PDA), portable multimedia player (PMP), navigation, drone, advanced driver assistance system (ADAS), and the like. The image sensor 500 may also be mounted on electronic devices provided as components of vehicles, furniture, manufacturing facilities, doors, and various measuring devices.

Figure 8A:
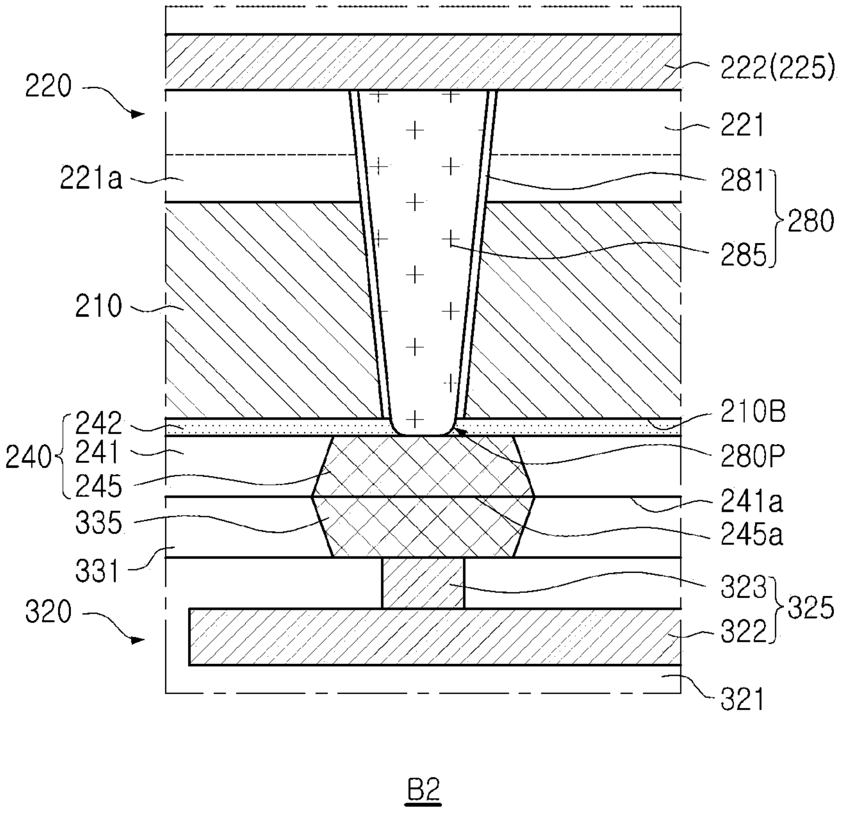
FIGS. 8A and 8B are enlarged diagrams illustrating various examples of a second bonding portion.
Figure 8B:
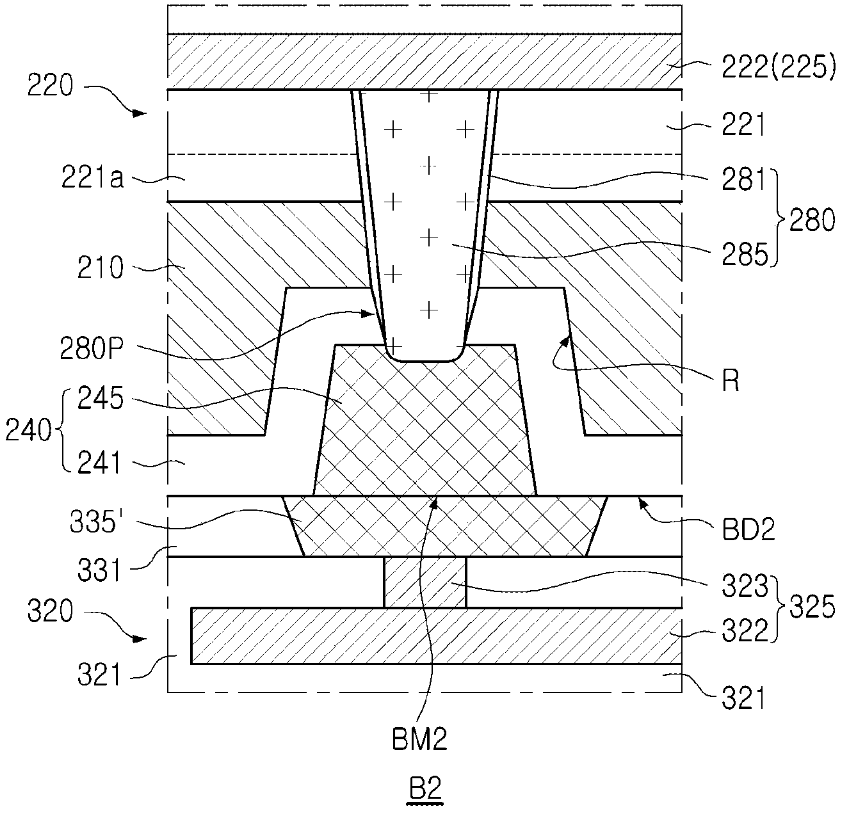

FIGS. 8A and 8B are enlarged diagrams illustrating various examples of a second bonding portion, illustrating portion "B2" in FIG. 3.

Referring to FIG. 8A, the second bonding structure according to some example embodiments may have a structure similar to the second bonding structure illustrated in FIGS. 3 and 5B other than the configuration in which the recessed portion is not formed on the second semiconductor substrate 210 and an etching stop layer 242 is provided. Also, the descriptions of components of some example embodiments may be the same as the descriptions of the same or similar components of the image sensor 500 and the second bonding structure illustrated in FIGS. 1 to 7 unless otherwise indicated.

The second semiconductor substrate 210 employed in some example embodiments may have a flat lower surface 210B, and the via structure 280 may penetrate through the second semiconductor substrate 210. The via structure 280 may have a protruding portion protruding from (e.g., projecting downwards from) the lower surface 210B of the second semiconductor substrate 210. In some example embodiments, the bonding layer 240 may further include an etching stop layer 242 disposed between the second semiconductor substrate 210 and the bonding insulating layer 241. The etching stop layer 242 may be disposed on the lower surface 210B of the second semiconductor substrate 210 to surround the protruding portion 280P of the via structure 280 (e.g., surround in a horizontal plane extending parallel to the lower surface 210B of the second semiconductor substrate 210). In some example embodiments, the protruding portion 280P of the via structure 280 may have a surface coplanar or substantially coplanar with a lower surface of the etching stop layer 242. The etching stop layer 242 may include a material different from that of the bonding insulating layer 241. For example, the etching stop layer 242 may include an aluminum compound such as AlN or $Al_2O_3$.

The protruding portion 280P may have a via plug 285 portion exposed by removing the insulating liner 281 portion. The second lower bonding pad 245 may be connected to the protruding portion 280P of the via structure 280, and may be connected to the second wiring layer 225 through the via structure 280.

The second lower bonding pad 245 may be disposed on (e.g., below, beneath, etc.) the etching stop layer 242 and may be buried in the bonding insulating layer 241 and may be connected to the protruding portion 280P of the via structure 280. Also, the second lower bonding pad 245 may have a surface (e.g., lower surface 245*a*) coplanar or substantially coplanar with a lower surface 241*a* of the bonding insulating layer 241.

The third wiring structure 320 may include a third bonding insulating film 331 in contact with the bonding insulating layer 241 and a third bonding pad 335 in contact with the second lower bonding pad 245. The second lower bonding pad 245 and the third bonding pad 335 may form intermetallic bonding BM2. Also, the bonding insulating layer 241 and the third bonding insulating film 331 may form dielectric-dielectric bonding BD2. The second wiring layer 225 and the third wiring layer 325 may be electrically connected to each other by intermetallic bonding BM2 between the second lower bonding pad 245 and the third bonding pad 335.

The etching stop layer 242 employed in some example embodiments may also be employed in the second bonding structure illustrated in FIG. 5B. For example, after the recessed portion R is formed and before the bonding insulating layer 241 is formed, an etching stop layer may be formed, and after the bonding insulating layer is formed, the bonding insulating layer 241 may be etched using an etching stop layer to expose the via structure 280.

Referring to FIG. 8B, the second bonding structure according to some example embodiments may have a structure similar to the second bonding structure illustrated in FIGS. 3 and 5B other than the configuration in which areas (or widths) of the second lower bonding pad 245 and third bonding pad 335' are different, and centers of the second lower bonding pad 245 and third bonding pad 335' are aligned in a staggered manner. Also, the descriptions of components of some example embodiments may be the same as the descriptions of the same or similar components of the image sensor 500 and the second bonding structure illustrated in FIGS. 1 to 7 unless otherwise indicated.

In some example embodiments, the second lower bonding pad 245 and the third bonding pad 335' may be configured to have different bonding areas (or widths). The third bonding pad 335' may have an area (or a width) different from that of the second lower bonding pad 245. Also, differently from the aforementioned example embodiments, the centers of the second lower bonding pad 245 and the third bonding pad 335' may be aligned in a staggered manner.

Figure 9:
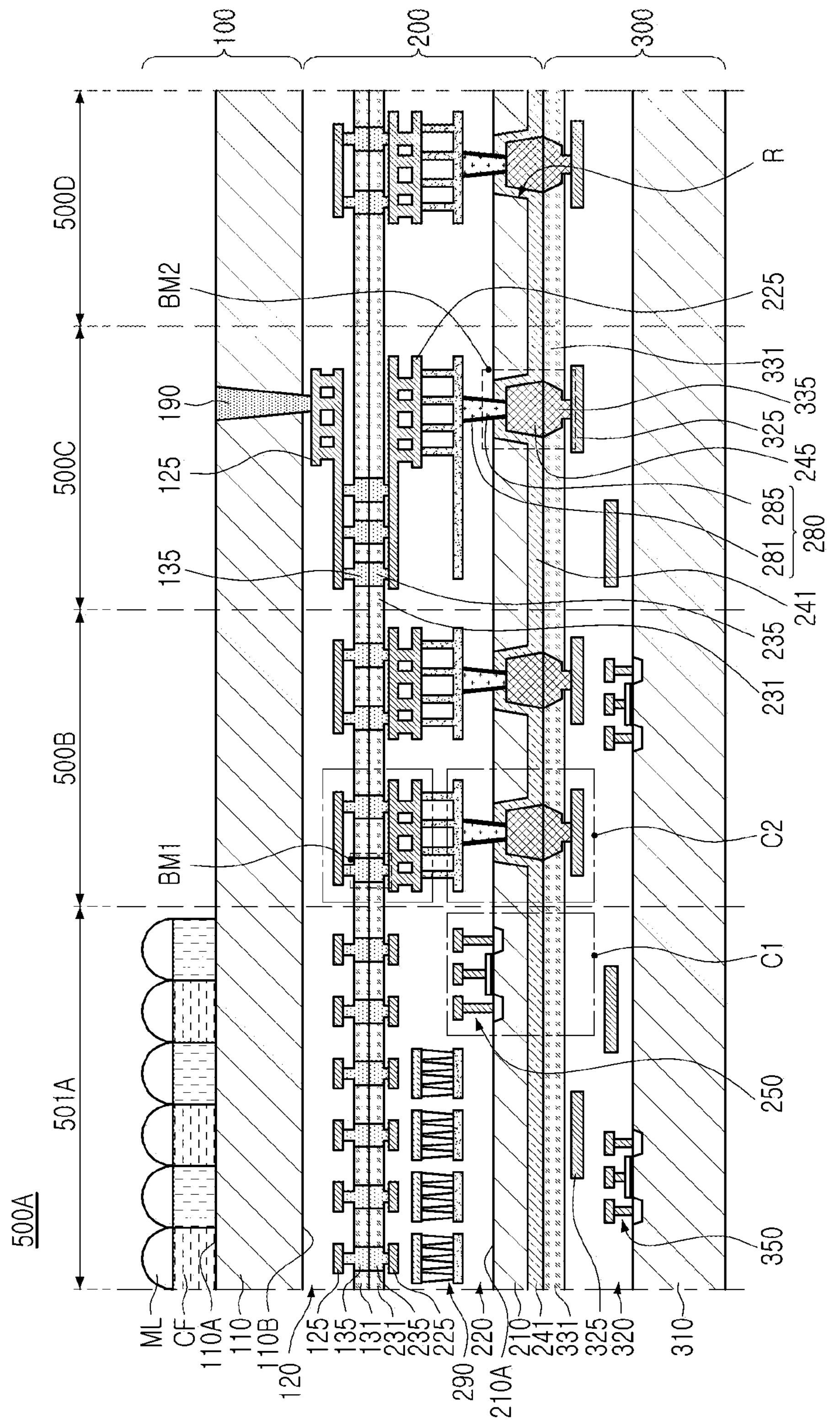
FIG. 9 is a cross-sectional diagram illustrating an image sensor according to some example embodiments of the present inventive concepts, viewed laterally.

FIG. 9 is a cross-sectional diagram illustrating an image sensor according to some example embodiments.

Referring to FIG. 9, an image sensor 500A according to some example embodiments may have a structure in which a first semiconductor chip 100, a second semiconductor chip 200 and a third semiconductor chip 300 are stacked similarly to the image sensor illustrated in FIGS. 2 and 3, and may include a pixel region 501A and peripheral regions 500B, 500C, and 500D.

The first to third semiconductor chips 100, 200 and 300 may include first to third semiconductor substrates 110, 210 and 310 and first to third wiring structures 120, 220 and 320 disposed on one surface thereof, respectively. The descriptions of components of some example embodiments may be the same as the descriptions of the same or similar components of the image sensor 500 illustrated in FIGS. 1 to 8B unless otherwise indicated.

In some example embodiments, similar to the aforementioned example embodiments, for bonding between the first and second semiconductor chips 100 and 200, the bonding surfaces of the first and second wiring structures 120 and 220 opposing each other may include first and second bonding insulating films 131 and 231 and a first bonding pad 135 and a second upper bonding pad 235 embedded therein. Also, for bonding between the second and third semiconductor chips 200 and 300, a bonding layer may be formed on the lower surface of the second semiconductor substrate 210. The bonding layer 240 may include a bonding insulating layer 241 and a second lower bonding pad 245 buried in the bonding insulating layer 241 and connected to the via structure 280. A third bonding insulating film 331 and a third bonding pad 335 embedded therein may be formed in the third wiring structure 320 bonded to face the bonding layer.

The image sensor 500A according to some example embodiments may be divided into a plurality of regions in a horizontal direction. The pixel region 501A may overlap a pixel array and may correspond to the main region in the aforementioned example embodiments, and may be configured to connect regions in which pixel circuits for driving pixels are formed. A pixel array may be formed on the first semiconductor substrate 110, and components for allowing light to be incident into the photodiode PD, such as a microlens ML and a color filter CF, may be disposed on the back side (or upper surface 110A) of the first semiconductor substrate 110. Also, devices included in the pixel circuit may be formed on the first and second semiconductor substrates 110 and 210 in a divided manner (see FIGS. 6 and 7).

The devices divided to the first and second semiconductor substrates 110 and 210 may be electrically connected to each other by first intermetallic bonding BM1 between the first bonding pad 135 and the second upper bonding pad 235. Specifically, first semiconductor devices (e.g., transfer transistors) disposed on (e.g., below) the lower surface 110B of the first semiconductor substrate 110 may be connected to the first wiring layer 125, and second semiconductor devices (250, other devices included in the pixel circuit) disposed on the upper surface 210A of the second semiconductor substrate 210 may be connected to the second wiring layer 225. The first bonding pad 135 connected to the first wiring layer 125 may be exposed to the lower surface of the first wiring structure 120, and similarly, the second upper bonding pad 235 connected to the second wiring layer 225 may be exposed to the upper surface of the second wiring structure 220. By bonding the exposed surfaces of the first bonding pad 135 and the second upper bonding pad 235, the first and second semiconductor devices may be connected to each other and may form a pixel circuit. Also, the first bonding insulating film 131 and the second bonding insulating film 231, which are the outermost layers of the first wiring structure 120 and the second wiring structure 220 and including the first bonding pad 135 and the second upper bonding pad 235 buried therein, respectively, may also be bonded.

The peripheral region may be disposed around the pixel region 501A, and may be subdivided into a plurality of first to third peripheral regions 500B, 500C, and 500D. The first to third peripheral regions 500B, 500C, and 500D may include the first intermetallic bonding BM1 between the first bonding pad 135 and the second upper bonding pad 235, and may also include the second intermetallic bonding BM2 between the second lower bonding pad 245 and the third bonding pad 335.

Specifically, the first peripheral region 500B may be adjacent to a pixel unit, and may include the first intermetallic bonding BM1 of the first bonding pad 135 and the second upper bonding pad 235 for bonding the first and second semiconductor chips 100 and 200 to each other. Also, the first peripheral region 500B may include the second intermetallic bonding BM2 between the second lower bonding pad 245 and the third bonding pad 335 for bonding the second and third semiconductor chips 200 and 300 to each other. By the second intermetallic bonding BM2 and the third wiring layer 325, the third semiconductor devices 350 included in the logic circuit formed on the third semiconductor substrate 310 and the pixel circuit implemented in the first and second semiconductor chips 100 and 200 may be connected to each other. Here, the second lower bonding pad 245 may be connected to the second wiring layer 225 as described in the aforementioned example embodiments, and may be configured to be connected to one end of the via structure 280 penetrating through the second semiconductor substrate 210. A thickness of the second semiconductor substrate 210 may be stably maintained by providing the second lower bonding pad 245 to a region below the second semiconductor substrate 210 through the via structure 280 prepared in advance. In some example embodiments, similarly to the example described with reference to FIG. 5B, a recessed portion R may be formed in the lower surface of the second semiconductor substrate 210 to dispose a portion of the second lower bonding pad 245 in the recessed portion R.

The second peripheral region 500C may be an input/output region including an input/output terminal for connecting the image sensor 500A to an external entity. In some example embodiments, the second peripheral region 500C may include a through via 190 used as an input/output terminal. The through via 190 may penetrate through the first semiconductor substrate 110 and may be connected to the first wiring layer 125. For example, the through via 190 may be connected to an upper wiring of the first wiring layer 125. Some example embodiments thereof are not limited thereto, and an input/output terminal such as the through via 190 may be disposed to penetrate through the third semiconductor substrate 310. Similarly to the first peripheral region 500B, the second peripheral region 500C may include first intermetallic bonding BM1 between the first bonding pad 135 and the second upper bonding pad 235 and second intermetallic bonding BM2 between the second lower bonding pad 245 and the third bonding pad 335.

The third peripheral region 500D may be included to reduce, minimize, or prevent issues occurring during the process of manufacturing the image sensor 500A. Similarly to the first and second peripheral regions 500B and 500C, the third peripheral region 500D may include first intermetallic bonding BM1 between the first bonding pad 135 and the second upper bonding pad 235 and second intermetallic bonding BM2 between the second lower bonding pad 245 and the third bonding pad 335.

Figure 10A:
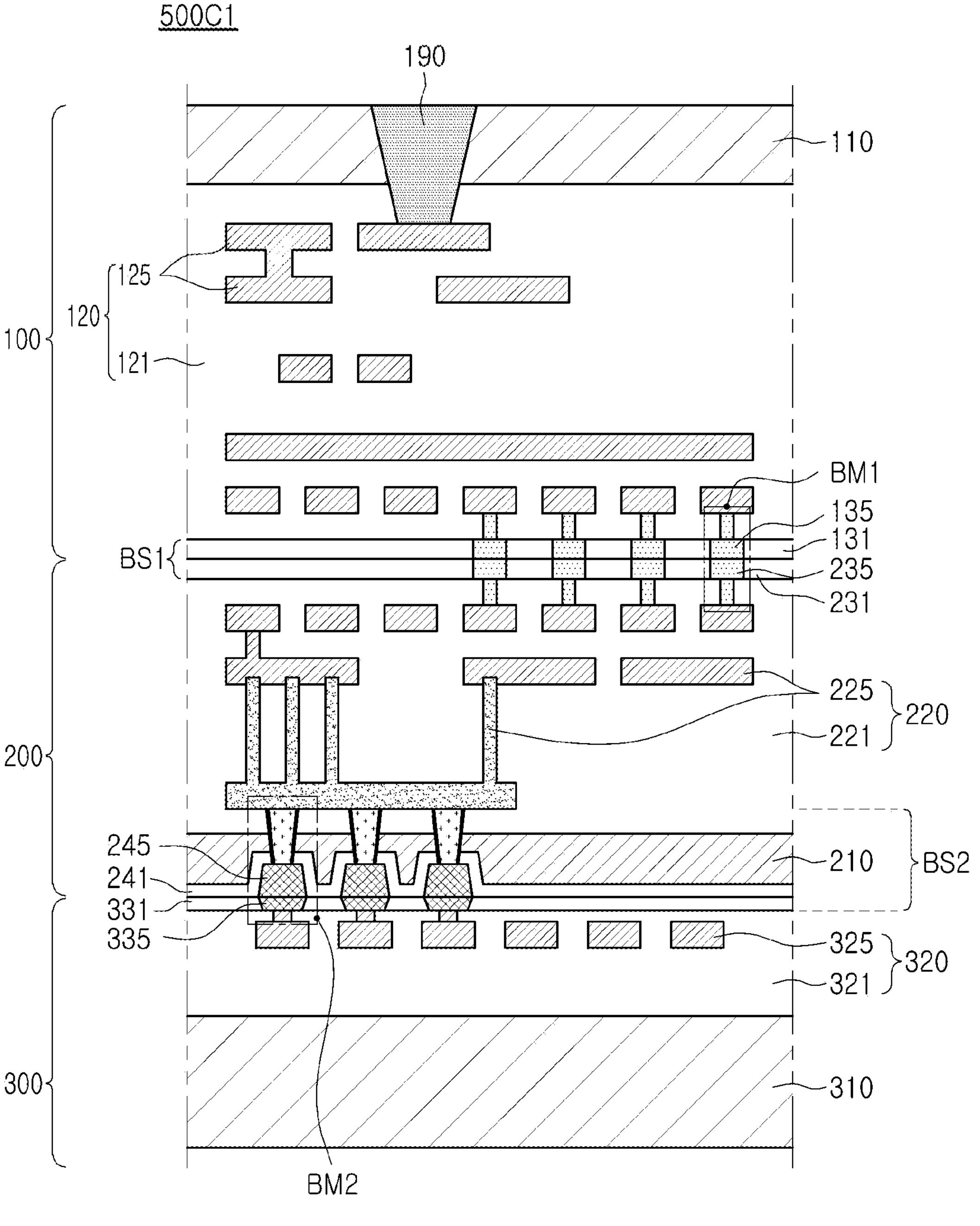
FIGS. 10A, 10B, and 10C are cross-sectional diagrams illustrating various examples of an input/output region employable in an image sensor according to some example embodiments of the present inventive concepts.
Figure 10B:
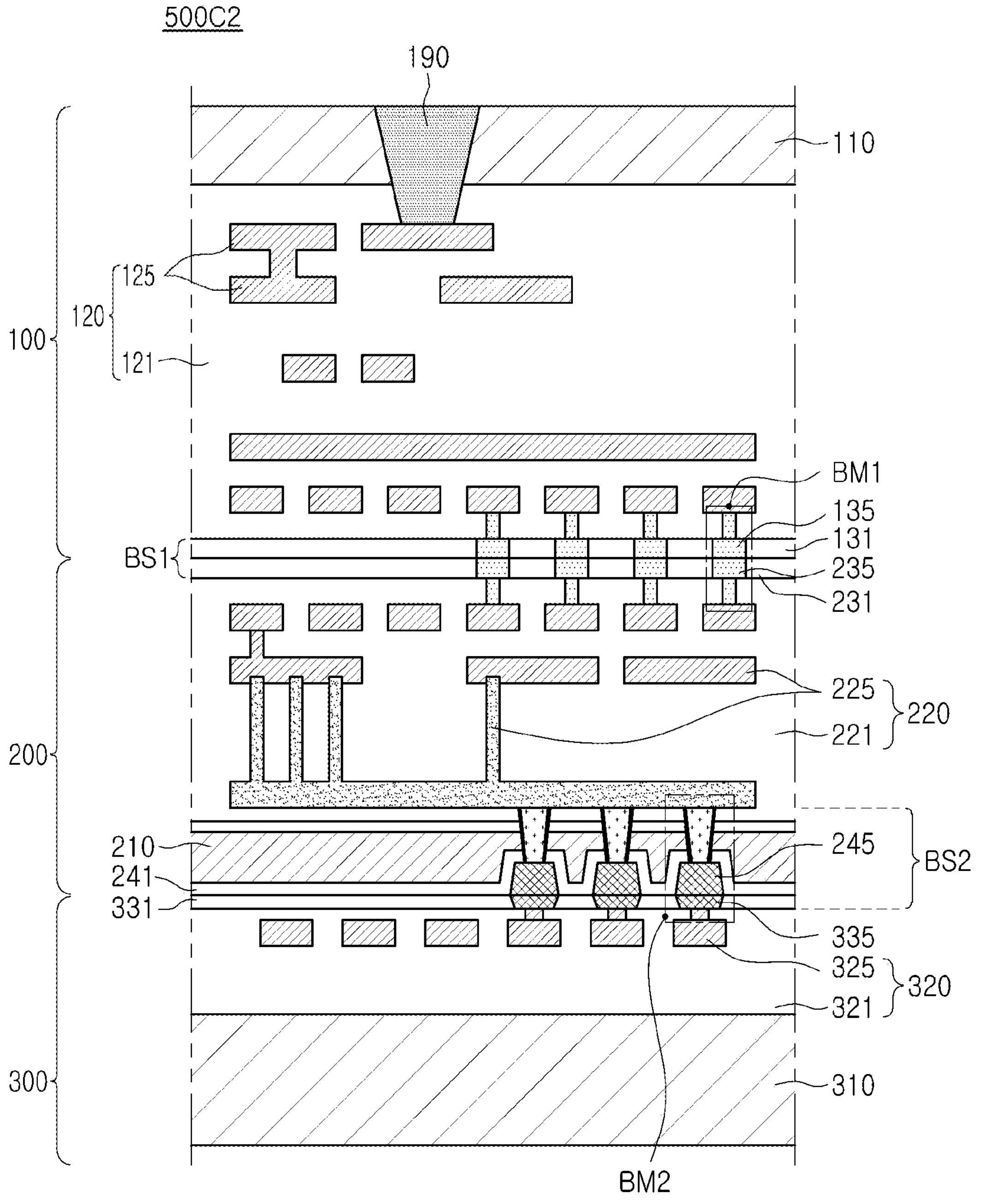
Figure 10C:
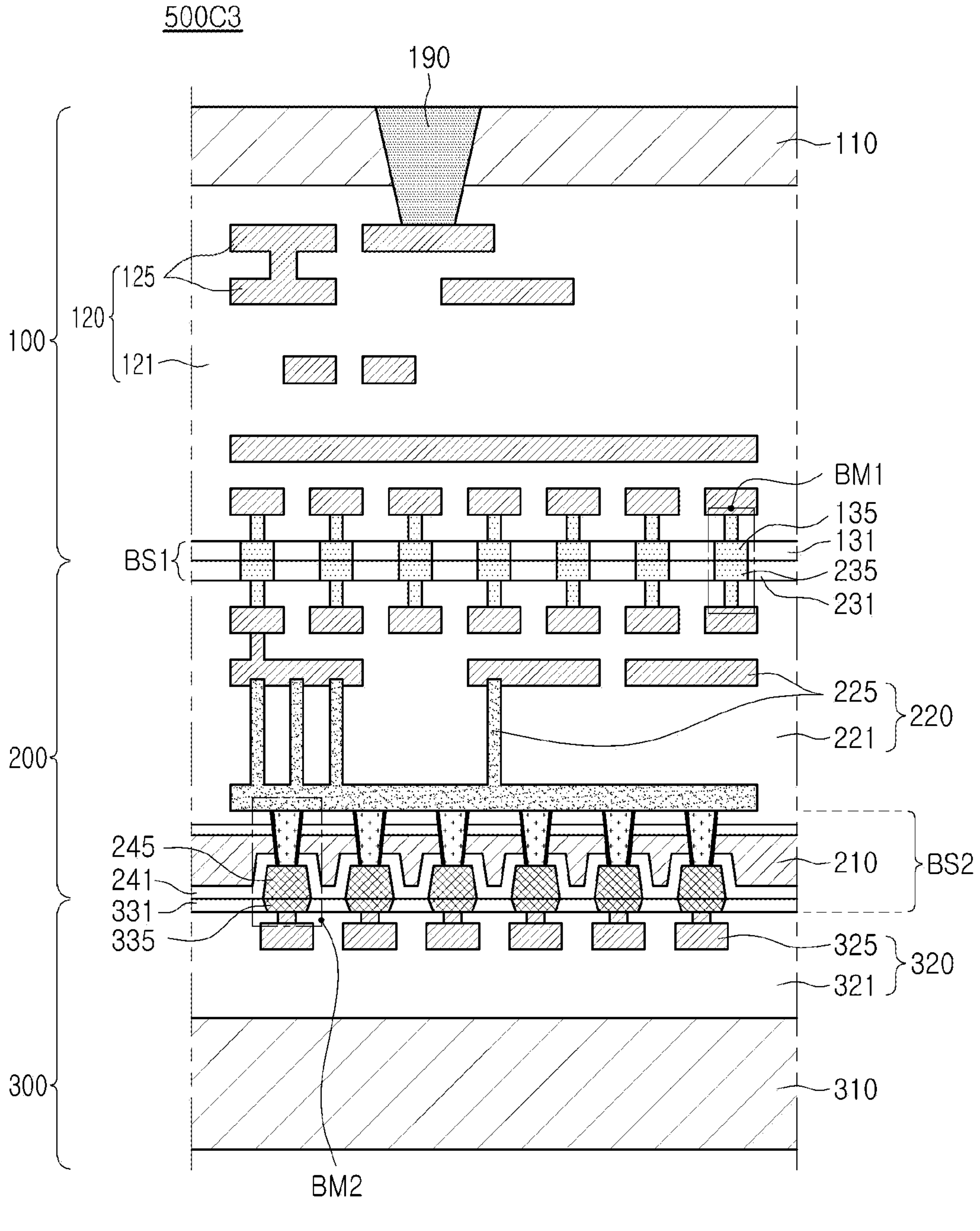

FIGS. 10A, 10B, and 10C are cross-sectional diagrams illustrating various examples of an input/output region employable in an image sensor according to some example embodiments.

The input/output regions 500C1, 500C2, and 500C3 illustrated in FIGS. 10A to 10C may include through vias 190 formed in the first semiconductor substrate 110, similarly to the aforementioned example embodiments, and the through vias 190 may be used as input/output terminals.

First, referring to FIG. 10A, in the input/output region 500C1 of the image sensor, first intermetallic bonding BM1 between the first bonding pad 135 and the second upper bonding pad 235 and second intermetallic bonding BM2 between the second lower bonding pad 245 and the third bonding pad 335 may be included.

In some example embodiments, the first intermetallic bonding BM1 and the second intermetallic bonding BM2 may be disposed to not overlap each other in a stacking direction of chips. An image sensor may be supported by the first intermetallic bonding BM1 and the second intermetallic bonding BM2 throughout a relatively large area. Accordingly, bending occurring in the process of using the image sensor may be reduced.

Referring to FIG. 10B, the first intermetallic bonding BM1 and the second intermetallic bonding BM2 may be disposed in positions overlapping each other in the stacking direction. Alternately, referring to FIG. 10C, for stronger bonding and stable support, a plurality of the first intermetallic bonding BM1 and a plurality of the second intermetallic bonding BM2 may be disposed throughout the entire area. As such, the first intermetallic bonding BM1 and the second intermetallic bonding BM2 may have various arrangements in the input/output region and also in the peripheral region.

Figure 11:
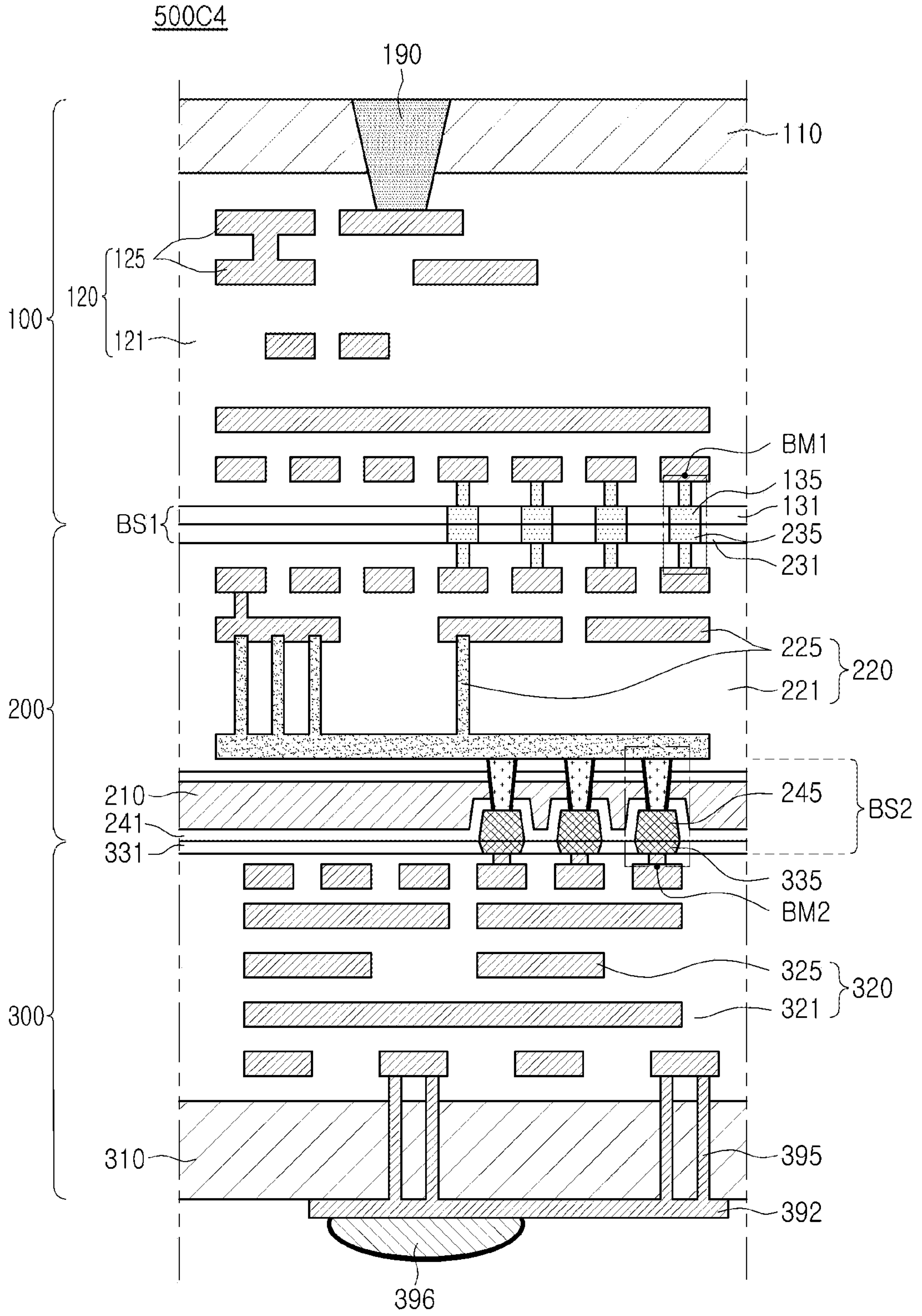
FIG. 11 is a cross-sectional diagram illustrating an example of an input/output region employable in an image sensor according to some example embodiments of the present inventive concepts.

FIG. 11 is a cross-sectional diagram illustrating an example of an input/output region employable in an image sensor according to some example embodiments.

Referring to FIG. 11, an input/output region 500C4 of an image sensor according to some example embodiments may include a through via 395 penetrating through the third semiconductor substrate 310 and connected to the third wiring layer 325. Differently from some example embodiments, for example the example embodiments shown in FIG. 10A, in some example embodiments, a plurality of the through vias 395 may be provided and may be connected to the conductive pattern 392 formed on the lower surface of the third semiconductor substrate 310. A metal bonding layer 396 such as solder may be formed on the conductive pattern 392, and the component may be connected to an external circuit through the metal bonding layer 396.

Figure 12:
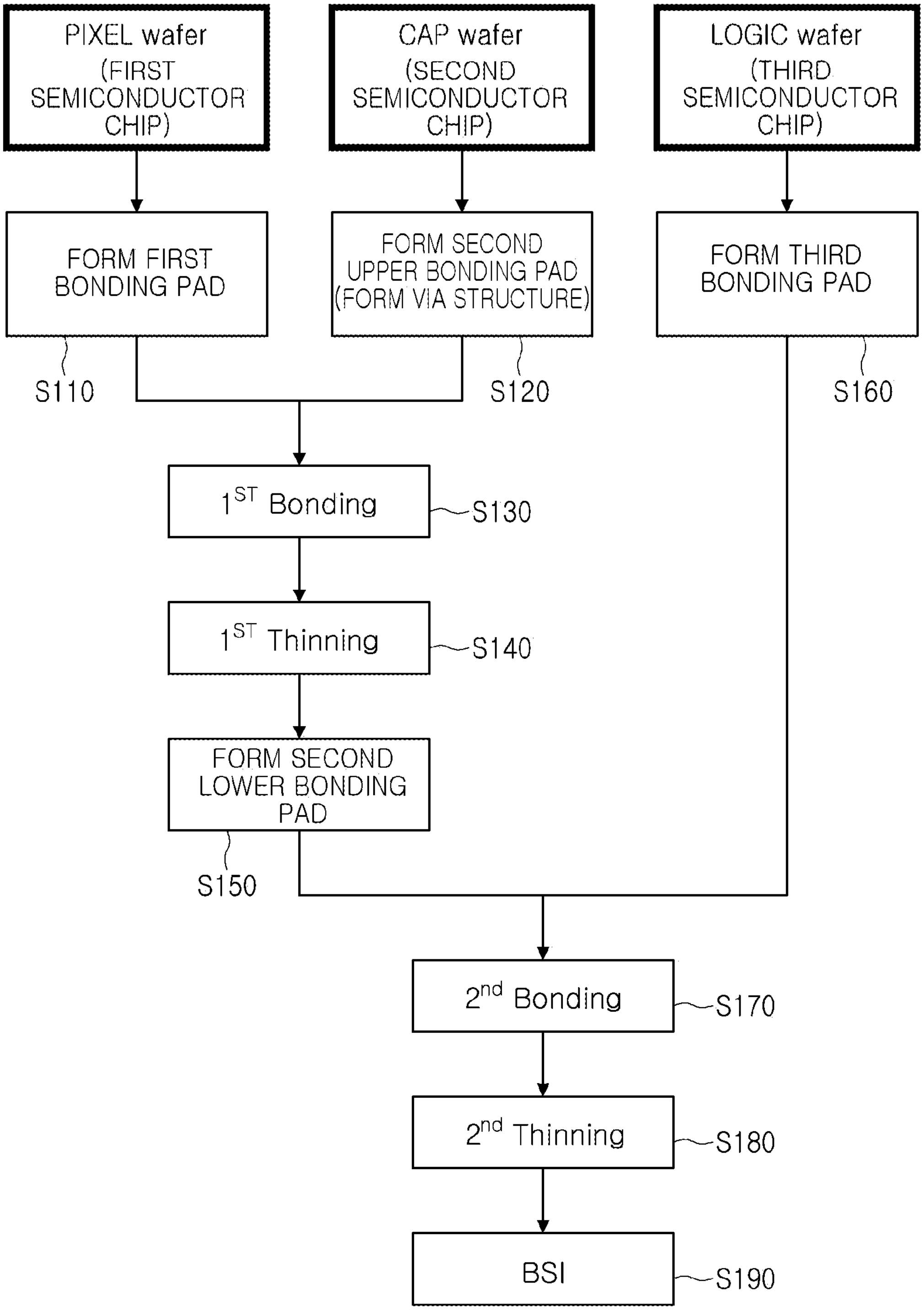
FIG. 12 is a flowchart illustrating a method of manufacturing an image sensor according to some example embodiments of the present inventive concepts.

FIG. 12 is a flowchart illustrating a method of manufacturing an image sensor according to some example embodiments.

Referring to FIG. 12, a method of manufacturing an image sensor according to some example embodiments may start with a process of manufacturing a first wafer (PIXEL wafer) for a first semiconductor chip, a second wafer (CAP wafer) for a second semiconductor chip, and a third wafer (LOGIC wafer) for a third semiconductor chip. The first semiconductor chip (PIXEL wafer) may include a pixel unit in which a plurality of unit pixels are arranged, and the second semiconductor chip (CAP wafer) may include a plurality of transistors and a plurality of capacitors to implement a global shutter operation. Also, a third semiconductor chip (LOGIC wafer) may include a logic circuit. In particular, in some example embodiments, in the process of forming the second wafer, one end of the via structure may penetrate through the second interlayer insulating film and may be formed to extend to a predetermined depth in the second semiconductor substrate, and a second wiring layer may be connected to the other end of the via structure (e.g., see FIGS. 13A to 13C).

Thereafter, a first bonding insulating film and first bonding pads buried in the first bonding insulating film and connected to the first wiring layer may be formed on one surface of the first wiring structure of the first wafer (PIXEL wafer) for the first semiconductor chip (S110), and a second bonding insulating film and second upper bonding pads buried in the second bonding insulating film and connected to the second wiring layer may be formed on one surface of the second wiring structure of the second wafer (CAP wafer) for the second semiconductor chip (S120).

Similarly to the first and second wafer, a third bonding insulating film and a third bonding pad buried in the third bonding insulating film and exposed may be formed on one surface of the third wiring structure of the third wafer (LOGIC wafer) for a third semiconductor chip (S160). The third bonding pad may be connected to the third wiring layer.

In operation S130, a plurality of first bonding pads formed on the first wafer (PIXEL wafer) and a plurality of second upper bonding pads formed on the second wafer (CAP wafer) may be bonded to each other by a primary bonding process.

Subsequently, in operation S140, one end of the via structure may be exposed by performing a primary thinning process such as a chemical mechanical polishing (CMP) on the second semiconductor substrate included in the second wafer (CAP wafer) (see FIGS. 13D and 14B). Thereafter, in operation S150, a bonding layer may be formed on the lower surface of the second semiconductor substrate. In particular, a bonding insulating layer may be formed on the lower surface of the second semiconductor substrate (see FIGS. 13F and 14C), and the second lower bonding pad may be formed in the bonding insulating layer to be connected to the exposed region of the via structure (FIGS. 13G and 14D). Accordingly, the second lower bonding pad of the combination of first and second wafers may form a desired three-stack wafer by bonding to the third bonding pad of the third wafer (LOGIC wafer).

In operation S170, the second lower bonding pad may be bonded to the third bonding pad of the third semiconductor chip by a secondary bonding process. Thereafter, in operation S180, a secondary thinning process for the first semiconductor substrate of the first wafer may be performed. After completing the secondary thinning process, by disposing an incident structure such as a microlens on the upper surface of the first semiconductor substrate polished in operation S190, a process of forming an image sensor by the back side illumination (BSI) method may be performed.

Hereinafter, in the process of manufacturing the above-described image sensor, a process of forming a bonding structure (a via structure and a bonding layer) of a second semiconductor chip (CAP wafer) for bonding between the second and third semiconductor chip (CAP and LOGIC wafers) will be described in greater detail.

FIGS. 13A, 13B, 13C, 13D, 13E, 13F, and 13G are cross-sectional diagrams illustrating main processes of a method of manufacturing the image sensor illustrated in FIG. 9 according to some example embodiments. The left and right sides in the cross-sectional diagrams may be regions corresponding to C1 and C2 of the image sensor in FIG. 9, respectively.

Figure 13A:
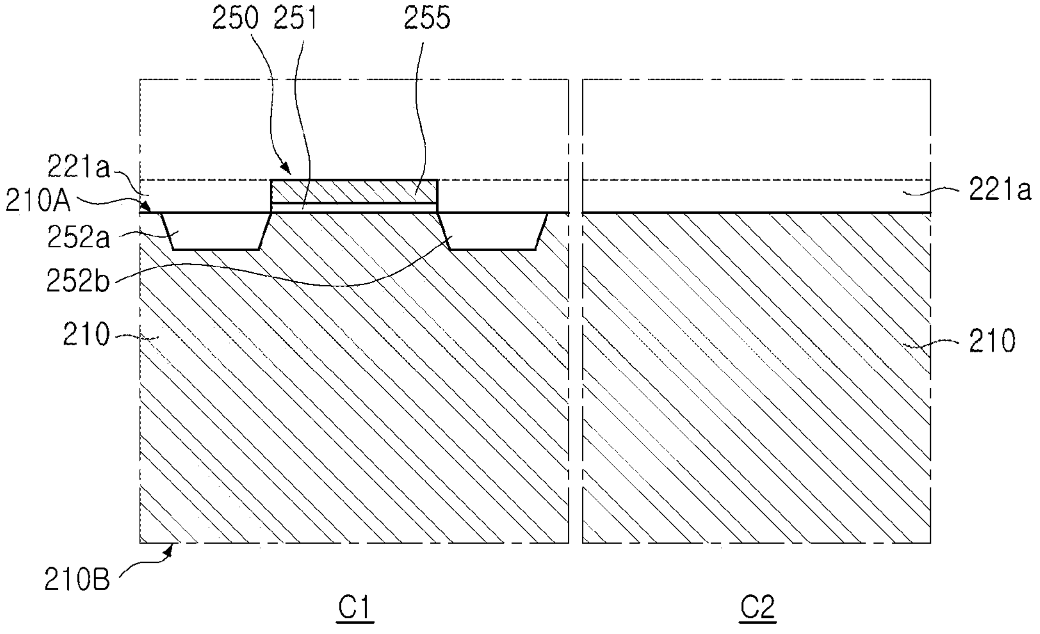
FIGS. 13A, 13B, 13C, 13D, 13E, 13F, and 13G are cross-sectional diagrams illustrating main processes of a method of manufacturing the image sensor illustrated in FIG. 9 according to some example embodiments of the present inventive concepts.

Referring to FIG. 13A, a second semiconductor device 250 may be formed on the upper surface 210A of the second semiconductor substrate 210. A region in which the second semiconductor device 250 is formed may be a pixel region C1 overlapping a pixel unit. As described above, the second semiconductor device 250 may include transistors included in a pixel circuit. Specifically, the second semiconductor device 250 may include a gate electrode 255, a gate insulating film 251 disposed between the gate electrode 255 and the second semiconductor substrate 210, and source/drain regions 252 (including source region 252*a* and drain region 252*b*) doped with impurities on both sides of the gate electrode 255. Also, a second interlayer insulating film 221*a* surrounding the second semiconductor device 250 may be formed on the upper surface 210A of the second semiconductor substrate 210.

Figure 13B:
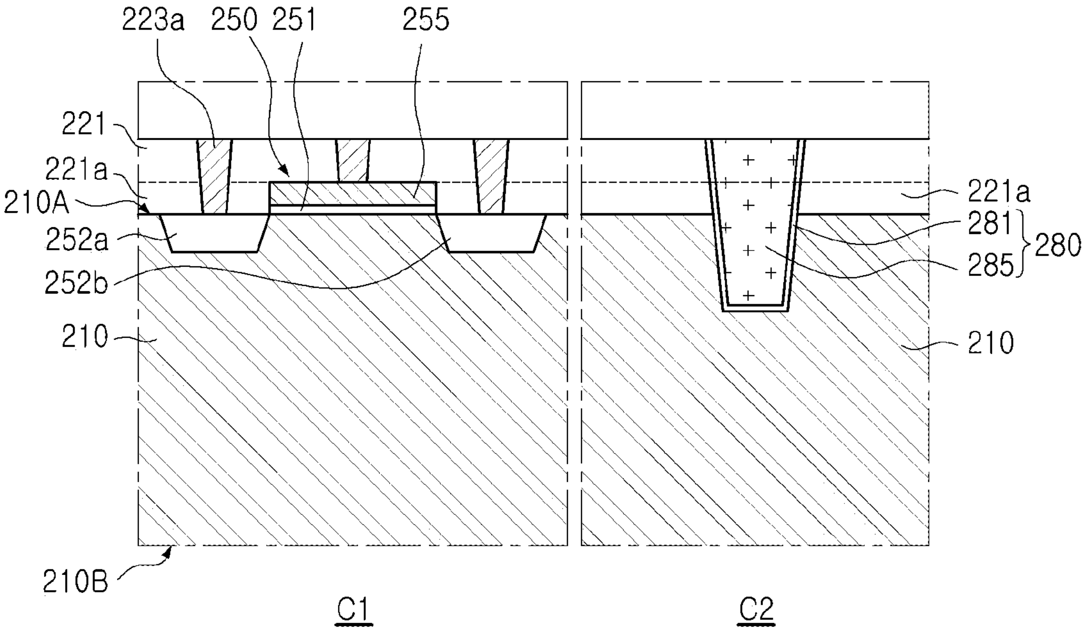

Subsequently, referring to FIG. 13B, a contact via 223*a* connected to the second semiconductor device 250 may be formed through the second interlayer insulating film 221*a* in the pixel region C1, and a via structure 280 penetrating through the second interlayer insulating film 221*a* and extending to the internal region of the second semiconductor substrate 210 may be formed in the peripheral region C2. The depth of the via structure 280 in the second semiconductor substrate 210 may be determined to enable the via structure 280 to be sufficiently exposed in consideration of the thickness of the second semiconductor substrate 210 after the thinning process and the depth of the recessed portion ("R" in FIG. 13E). The via structure 280 may include an insulating liner 281 conformally formed on the sidewall and bottom surface of the via hole, and a via plug 285 filling the via hole.

Figure 13C:
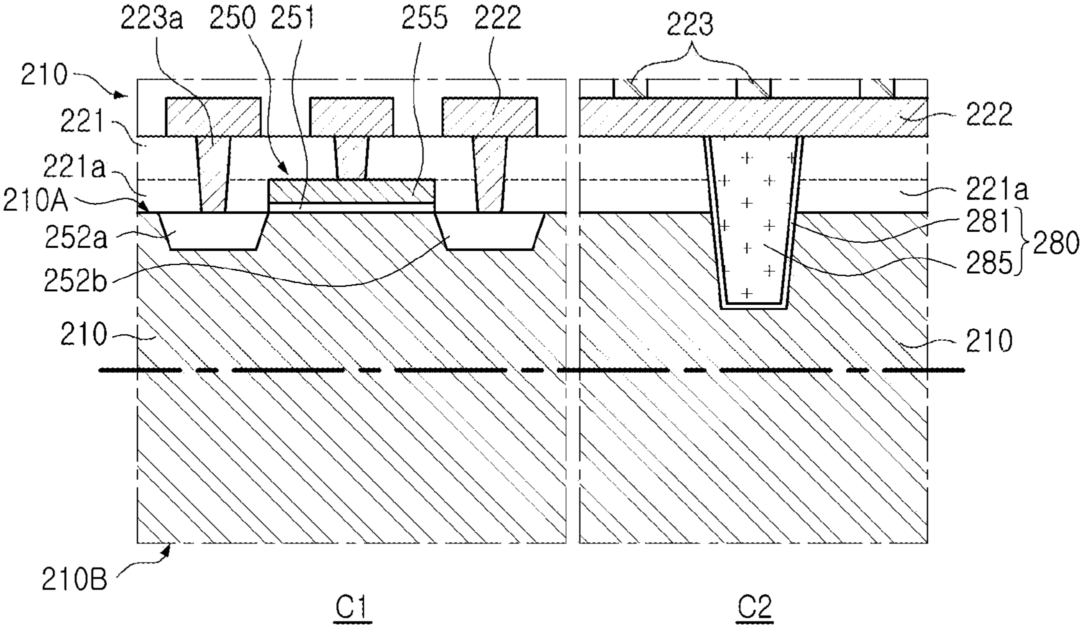
Figure 13D:
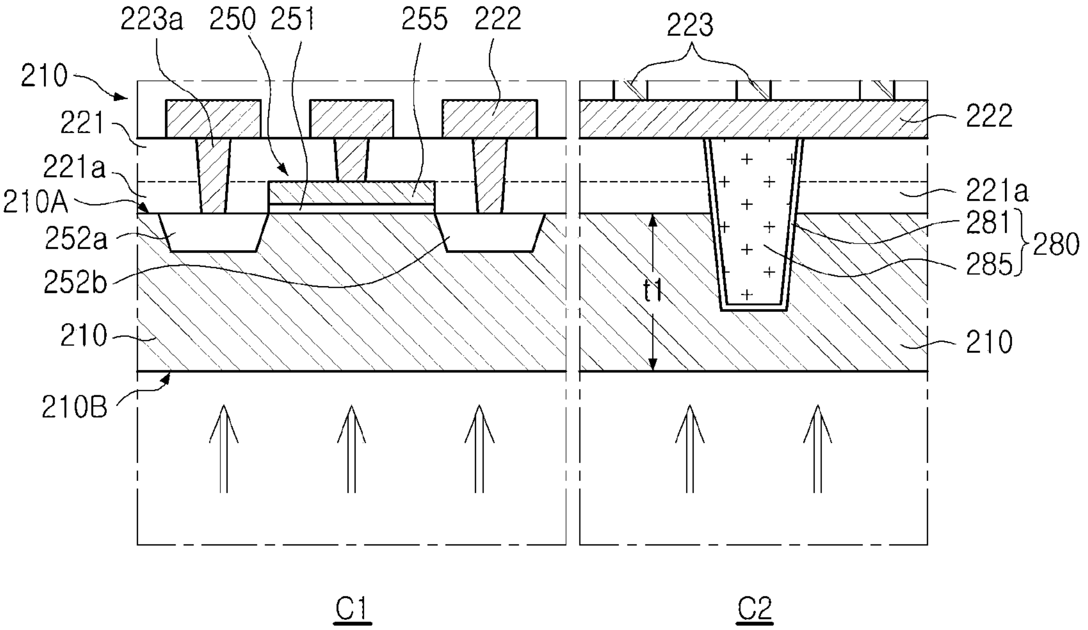

Thereafter, referring to FIG. 13C, a process of forming a second wiring structure 220 on the second interlayer insulating film 221*a* may be performed. Specifically, the second wiring line 222 may be formed on the second interlayer insulating film 221*a*. The second wiring line 222 may be connected to the contact via 223*a* and the via structure 280. By forming a second insulating layer 221 and a second wiring via 223 connected to second wiring line 222 and an additional wiring line, a desired second wiring layer 225 may be formed. In this way, the second wiring layer 225 may be connected to the contact via 223*a* and also the via structure 280.

Subsequently, referring to FIG. 13D, a process of thinning the second semiconductor substrate 210 may be performed. This process may be performed by a CMP process for the lower surface 210B of the second semiconductor substrate 210. The thinning process may be performed such that the via structure 280 may not be exposed in consideration of the depth of the recessed portion R to be formed in a subsequent process. A thickness t1 of the second semiconductor substrate 210 may be greater than or equal to 1.5 μm. In some example embodiments, the thickness t1 of the second semiconductor substrate 210 may be in the range of 2 μm to 5 μm.

Figure 13E:
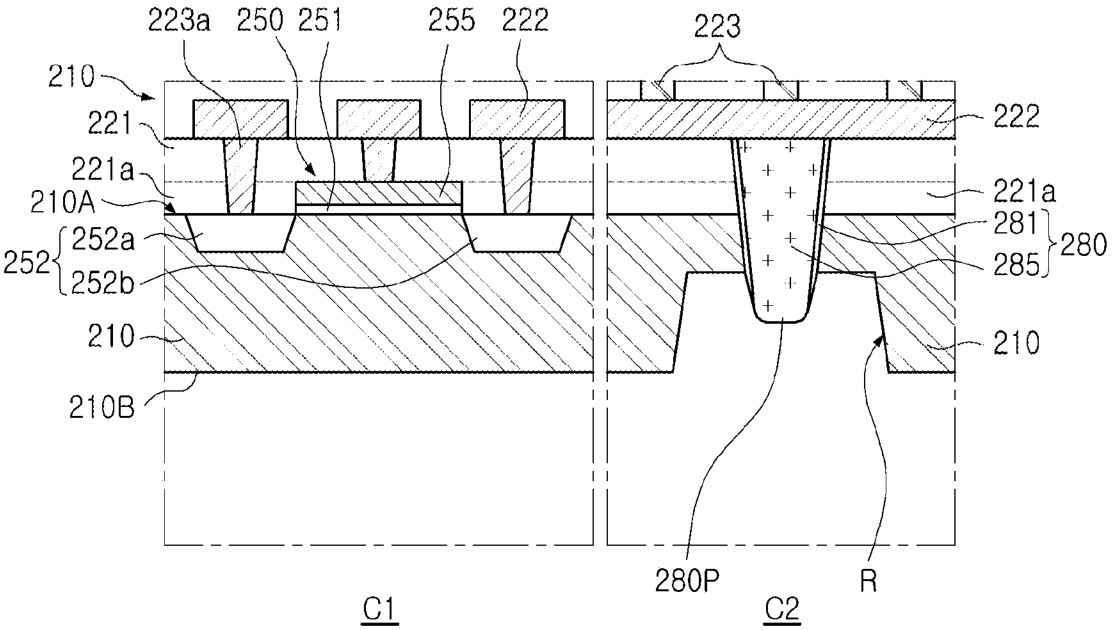
Figure 13F:
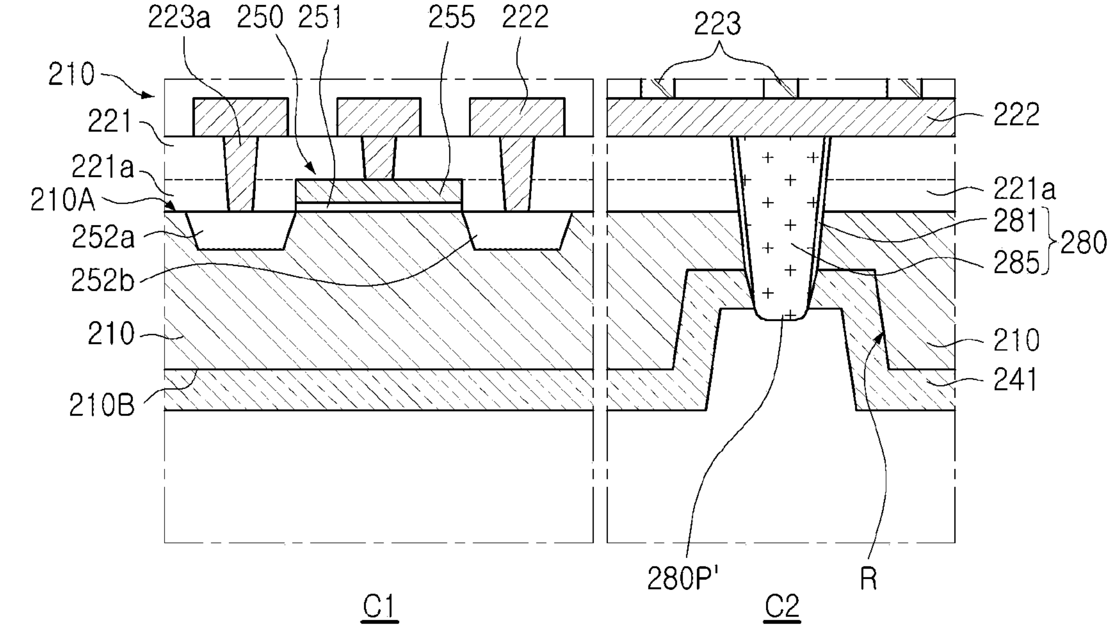
Figure 13G:
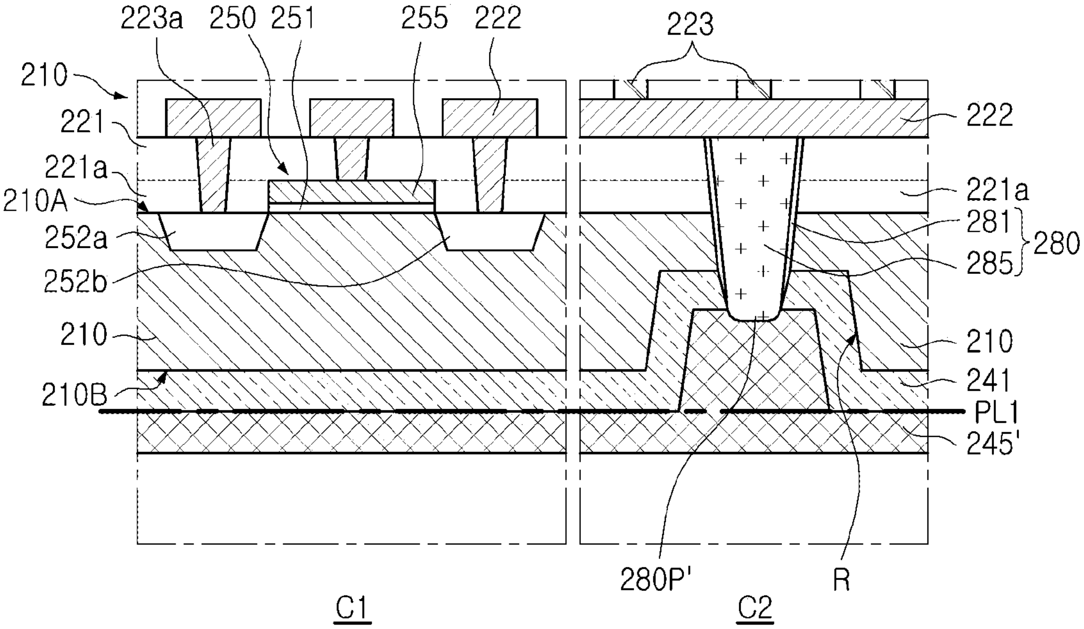

Thereafter, referring to FIG. 13E, a recessed portion R may be formed on the lower surface 210B of the second semiconductor substrate 210 to expose a portion of the via structure 280. In this process, the insulating liner 281 disposed on the protruding portion 280P of the via structure 280 may be partially removed.

Subsequently, referring to FIG. 13F, a bonding insulating layer 241 may be formed on the lower surface 210B and the surface of the recessed portion R of the second semiconductor substrate 210, and the protruding portion 280P of the via structure 280 may be exposed through a selective etching process as exposed portion 280P'. In this process, the via plug 285 portion may be exposed such that the exposed portion 280P' of the via structure 280 may be electrically connected. In some example embodiments, a layer (e.g., an etching stop layer) different from the bonding insulating layer 241 may be in advance formed on the second semiconductor substrate 210 before the bonding insulating layer 241 is formed.

Thereafter, referring to FIG. 13G, a metal layer 245' may be formed such that a portion of the metal layer 245' may be filled in the recessed portion R in the lower surface 210B of the second semiconductor substrate 210. Subsequently, a polishing process may be performed up to the line "PL1" such that the metal layer 245' portion around the recessed portion R may be removed and the second lower bonding pad 245 may be formed on the recessed portion R. Accordingly, the second lower bonding pad 245 may have a surface substantially coplanar with one surface of the bonding insulating layer 241.

FIGS. 14A to 14D are cross-sectional diagrams illustrating main processes of a method of manufacturing the image sensor illustrated in FIG. 8A according to some example embodiments.

Figure 14A:
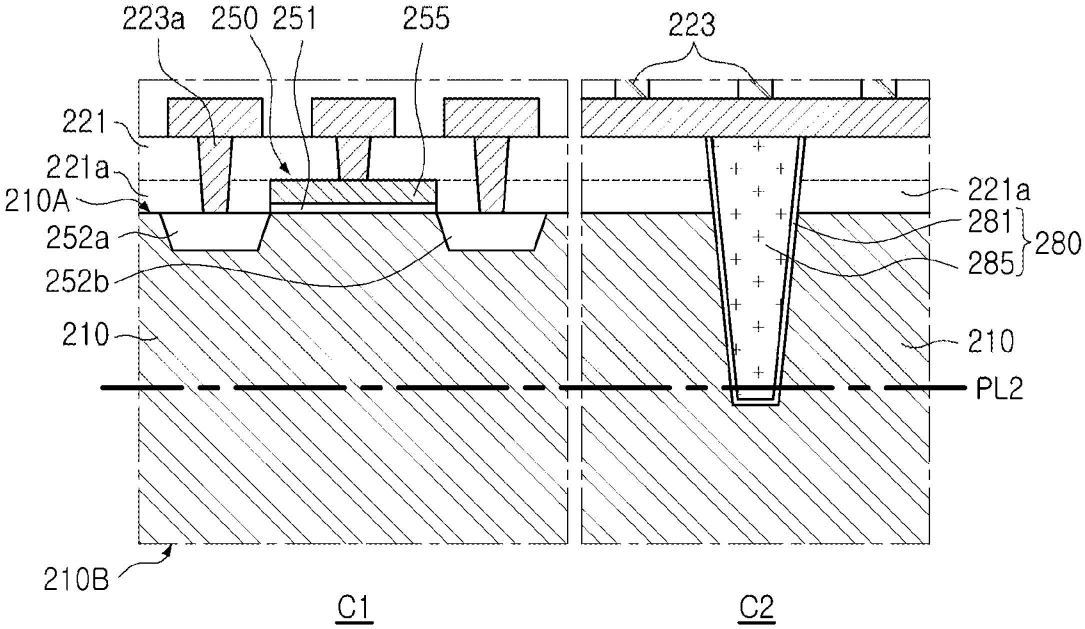
FIGS. 14A, 14B, 14C, and 14D are cross-sectional diagrams illustrating main processes of a method of manufacturing the image sensor illustrated in FIG. 8A according to some example embodiments of the present inventive concepts.

The example in FIG. 14A may be a result of the process in FIG. 13C. Specifically, the example in FIG. 14A may be a result of the process in FIG. 13A (forming the second semiconductor device), the process in FIG. 13B (forming the contact vias and the via structures), and the process in FIG. 13C (forming the second wiring structure). However, in some example embodiments, since an additional recess is not provided, the via structure 280 employed in some example embodiments may have a deeper depth in the second semiconductor substrate 210 than that of the aforementioned example embodiments. That is, the depth may be formed deeper than the line PL2 to be polished in a subsequent process.

Figure 14B:
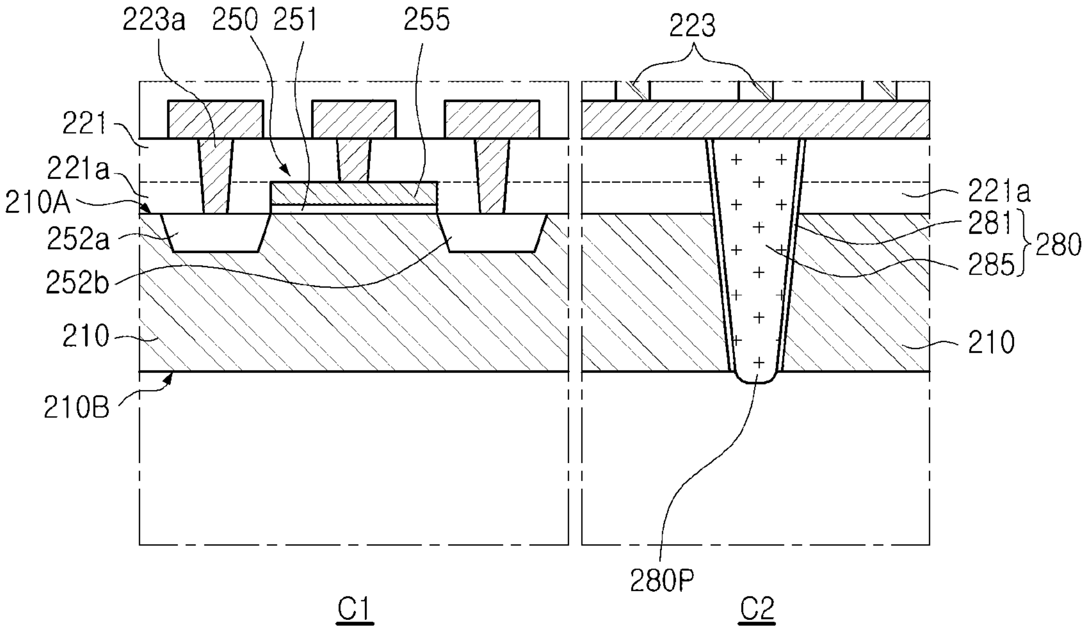

Thereafter, referring to FIG. 14B, a process of thinning the second semiconductor substrate 210 may be performed. The process may be performed by a CMP process for the lower surface 210B of the second semiconductor substrate 210. In some example embodiments, a partial region of the via structure 280 may be exposed to the lower surface 210B of the second semiconductor substrate 210. For example, the thickness of the second semiconductor substrate 210 may be in the range of 2 μm to 5 μm. In this process, the insulating liner 281 disposed on the protruding portion 280P of the via structure 280 may be partially removed.

Figure 14C:
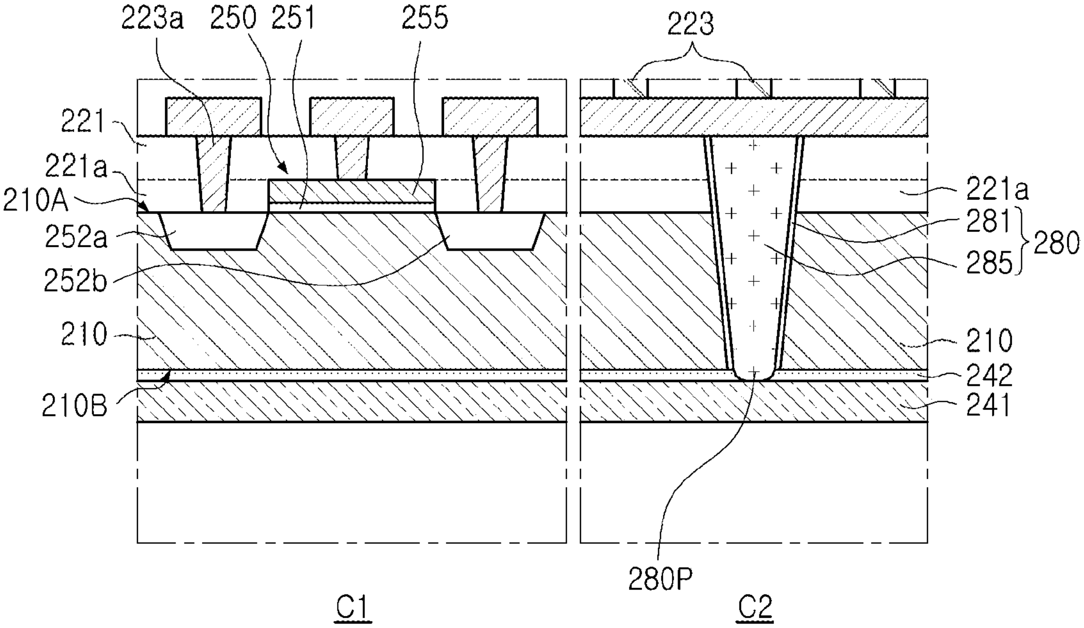
Figure 14D:
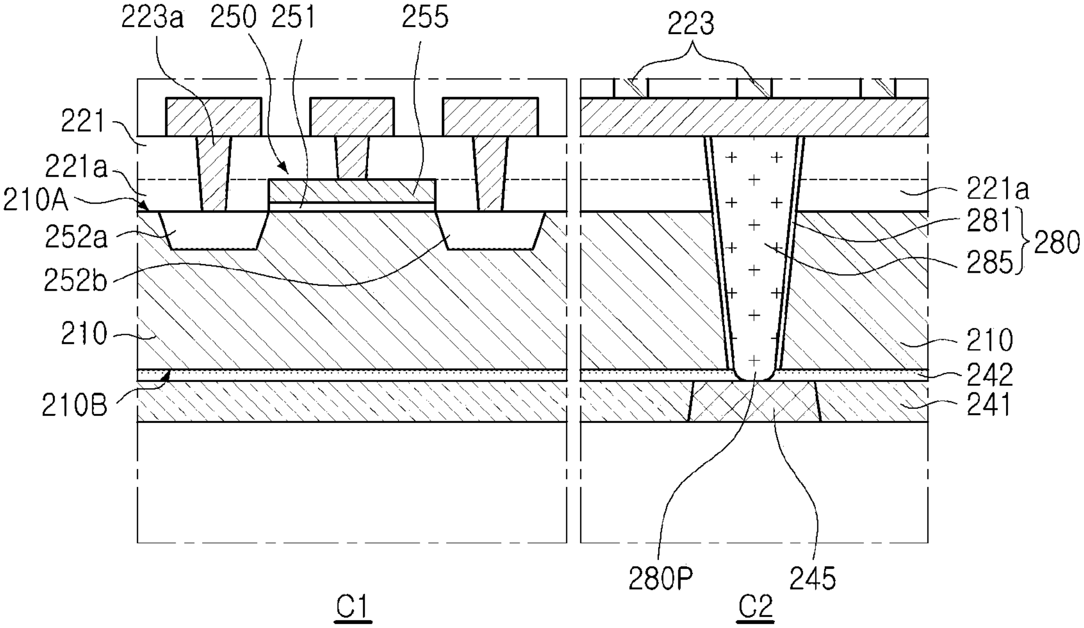

Thereafter, referring to FIG. 14C, an etching stop layer 242 may be formed on the lower surface 210B of the second semiconductor substrate 210, a polishing process may be performed to expose the contact region of the via structure 280, and a bonding insulating layer 241 may be formed. Thereafter, referring to FIG. 14D, an opening for a bonding pad may be formed such that the protruding portion 280P of the via structure 280 may be exposed through a selective etching process using an etching stop layer 242, and a second lower bonding pad 245 connected to the protruding portion 280P of the via structure 280 may be formed using a process similar to the example in FIG. 13G.

According to the aforementioned example embodiments, by forming a via structure penetrating through the second semiconductor substrate in a three-stack image sensor in advance, a pad structure for bonding with a third semiconductor chip may be formed without greatly reducing the thickness of the second semiconductor substrate (e.g., 1.5 μm or more). Accordingly, a well having a sufficient depth for simultaneously forming various logic and analog devices on the second semiconductor substrate may be stably formed, thereby improving reliability of the three-stack image sensor based on providing sufficient thickness of the second semiconductor chip for forming the aforementioned devices thereon while also enabling reliable bonding and thus electrical connection between the second and third semiconductor chips of the image sensor.

As described herein, any devices, electronic devices, modules, units, and/or portions thereof according to any of the example embodiments, and/or any portions thereof (including, without limitation, the image sensor 10, the pixel array 11, the row driver 12, the readout circuit 13, the ADC circuit 13*a*, the data bus 13*b*, the ramp signal generator 14, the timing controller 15, the image signal processor 19, the first semiconductor chip 100, the first semiconductor devices 150, the second semiconductor chip 200, the second semiconductor devices 250, the third semiconductor chip 300, the third semiconductor devices 350, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

While some example embodiments have been illustrated and described above, it will be configured as apparent to those skilled in the art that modifications and variations could be made without departing from the scope of the present inventive concepts as defined by the appended claims.

What is claimed is:

1. An image sensor, comprising:

a first semiconductor chip including
- a first semiconductor substrate having a pixel unit in which a plurality of pixels are arranged,
- a first wiring structure on the first semiconductor substrate and having a first wiring layer, and
- a first bonding pad exposed to one surface of the first wiring structure and connected to the first wiring layer;

a second semiconductor chip including
- a second semiconductor substrate having a first surface on which at least a portion of a plurality of transistors of a pixel signal generator circuit are located and a second surface opposite to the first surface,
- a second wiring structure on the first surface of the second semiconductor substrate, the second wiring structure having one surface in contact with the one surface of the first wiring structure, the second wiring structure having a second wiring layer,
- a second upper bonding pad exposed to the one surface of the second wiring structure and bonded to the first bonding pad, and
- a via structure connected to the second wiring layer and extending to the second surface of the second semiconductor substrate, the via structure including
  - a via plug, and
  - an insulating liner surrounding a side surface of the via plug,
  - wherein the via plug includes a protruding portion that is exposed axially and protruding from the insulating liner along a longitudinal axis of the via plug;

a bonding layer including
- a bonding insulating layer on the second surface of the second semiconductor substrate, and
- a second lower bonding pad buried in the bonding insulating layer and exposed to one surface of the bonding insulating layer,
- wherein the via plug connects the second wiring layer to the second lower bonding pad,
- wherein the protruding portion of the via plug contacts the second lower bonding pad, such that the second lower bonding pad is connected to the via structure; and a third semiconductor chip including
- a third semiconductor substrate having one surface on which logic devices are located,
- a third wiring structure on the one surface of the third semiconductor substrate, the third wiring structure having a third wiring layer, the third wiring structure having one surface in contact with the one surface of the bonding insulating layer, and a third bonding pad connected to the third wiring layer and exposed to the one surface of the third wiring structure, the third bonding pad bonded to the second lower bonding pad.

2. The image sensor of claim 1, wherein the second semiconductor substrate has a thickness of 2 μm to 5 μm.

3. The image sensor of claim 1, wherein the via plug includes tungsten (W) or copper (Cu).

4. The image sensor of claim 1, wherein the via structure has a width decreasing from the second wiring layer toward the second lower bonding pad.

5. The image sensor of claim 1, wherein the second semiconductor substrate has one or more inner surfaces defining a recessed portion on the second surface, and the via structure penetrates the second semiconductor substrate at the recessed portion, and wherein the bonding insulating layer is on the second surface of the second semiconductor substrate and extends to a surface of the recessed portion.

6. The image sensor of claim 5, wherein the second lower bonding pad is in the recessed portion and has a surface substantially coplanar with the one surface of the bonding insulating layer.

7. The image sensor of claim 1, wherein the second surface of the second semiconductor substrate has a planar surface, and the via structure penetrates through the second semiconductor substrate and has a protruding portion protruding from the second surface of the second semiconductor substrate, and wherein the bonding layer further includes an etching stop layer between the second semiconductor substrate and the bonding insulating layer and surrounding the protruding portion of the via structure.

8. The image sensor of claim 7, wherein the second lower bonding pad is connected to the protruding portion of the via structure on the etching stop layer and has a surface substantially coplanar with the one surface of the bonding insulating layer.

9. The image sensor of claim 1, wherein the first wiring structure includes a first bonding insulating film in which the first bonding pad is buried and having one surface substantially coplanar with an exposed region of the first bonding pad, wherein the second wiring structure includes a second bonding insulating film in which the second upper bonding pad is buried and has one surface substantially coplanar with an exposed region of the second upper bonding pad, and wherein the one surface of the first bonding insulating film is bonded to the one surface of the second bonding insulating film.

10. The image sensor of claim 1, wherein an exposed region of the second lower bonding pad has a surface substantially coplanar with the one surface of the bonding insulating layer, wherein the third wiring structure includes a third bonding insulating film in which the third bonding pad is buried and having one surface substantially coplanar with an exposed region of the third bonding pad, and wherein the one surface of the bonding insulating layer is bonded to the one surface of the third bonding insulating film.

11. The image sensor of claim 1, wherein the second semiconductor chip includes a capacitor structure in the second wiring structure and connected to the first wiring layer.

12. The image sensor of claim 1, wherein a transfer transistor of the pixel signal generator circuit is on the first semiconductor substrate, and wherein the portion of the plurality of transistors of the pixel signal generator circuit that are on the second semiconductor substrate include transistors other than the transfer transistor among the plurality of transistors of the pixel signal generator circuit.

13. The image sensor of claim 1, wherein a separate portion of the plurality of transistors of the pixel signal generator circuit includes a transfer transistor, a reset transistor, and a driver transistor, which are on the first semiconductor substrate.

14. An image sensor, comprising:

a first semiconductor chip including a first semiconductor substrate having a first region in which a plurality of pixels are arranged and a second region around the first region, a first wiring structure on a lower surface of the first semiconductor substrate and having a first wiring layer, and a first bonding pad exposed to the lower surface of the first wiring structure and connected to the first wiring layer;

a second semiconductor chip including a second semiconductor substrate having an upper surface on which transistors of a pixel signal generator circuit are located and a lower surface having a recessed portion in a region overlapping the second region, a second wiring structure on the upper surface of the second semiconductor substrate, the second wiring structure in contact with the first wiring structure, the second wiring structure having a second wiring layer, a second upper bonding pad exposed to an upper surface of the second wiring structure and bonded to the first bonding pad, and a via structure connected to the second wiring layer and penetrating through the recessed portion of the second semiconductor substrate, the via structure including a via plug, and an insulating liner surrounding a side surface of the via plug, wherein the via plug includes a protruding portion that is exposed axially and protruding from the insulating liner along a longitudinal axis of the via plug;

a bonding layer including a bonding insulating layer on the lower surface of the second semiconductor substrate and extending to the recessed portion, and a second lower bonding pad buried in the bonding insulating layer, the second lower bonding pad exposed to a lower surface of the bonding insulating layer, wherein the via plug connects the second wiring layer to the second lower bonding pad, wherein the protruding portion of the via plug contacts the second lower bonding pad, such that the second lower bonding pad is connected to the via structure in the recessed portion; and a third semiconductor chip including a third semiconductor substrate having an upper surface on which logic devices are located, a third wiring structure on the upper surface of the third semiconductor substrate, the third wiring structure in contact with the bonding insulating layer, the third wiring structure having a third wiring layer, and a third bonding pad exposed to an upper surface of the third wiring structure, the third bonding pad bonded to the second lower bonding pad, the third bonding pad connected to the third wiring layer.

15. The image sensor of claim 14, wherein the via plug has a width decreasing from the second wiring layer toward the second lower bonding pad.

16. The image sensor of claim 14, wherein the via plug and the second lower bonding pad include different metals.

17. The image sensor of claim 14, wherein the second lower bonding pad has a surface substantially planar with a lower surface of the bonding insulating layer, wherein the third wiring structure includes a bonding insulating film in which the third bonding pad is buried and having an upper surface substantially coplanar with an exposed region of the third bonding pad, and wherein the lower surface of the bonding insulating layer is bonded to the upper surface of the bonding insulating film.

18. The image sensor of claim 14, wherein the first bonding pad and the second upper bonding pad are arranged in regions overlapping the first region and the second region of the first semiconductor substrate, and wherein the third bonding pad and the second lower bonding pad are arranged in regions overlapping the second region of the first semiconductor substrate.

19. An image sensor, comprising:

a first semiconductor chip including a first semiconductor substrate having a first region in which a plurality of pixels are arranged and a second region around the first region, a first wiring structure on a lower surface of the first semiconductor substrate and having a first wiring layer, and a first bonding pad exposed to a lower surface of the first wiring structure and connected to the first wiring layer;

a second semiconductor chip including a second semiconductor substrate having an upper surface on which transistors of a pixel signal generator circuit are located, a second wiring structure on the upper surface of the second semiconductor substrate, the second wiring structure in contact with the first wiring structure, the second wiring structure having a second wiring layer, a second upper bonding pad exposed to an upper surface of the second wiring structure and bonded to the first bonding pad, and a via structure connected to the second wiring layer, the via structure penetrating through a region of the second semiconductor substrate overlapping the second region of the first semiconductor substrate, the via structure including a via plug, and an insulating liner surrounding a side surface of the via plug, wherein the via plug includes a protruding portion that is exposed axially from and protruding from the insulating liner along a longitudinal axis of the via plug;

a bonding layer including an etching stop layer on the lower surface of the second semiconductor substrate and surrounding an exposed portion of the via structure, the etching stop layer extending in a horizontal plane parallel to the lower surface of the second semiconductor substrate, a bonding insulating layer on the etching stop layer, and a second lower bonding pad buried in the bonding insulating layer, the second lower bonding pad exposed to a lower surface of the bonding insulating layer, wherein the via plug connects the second wiring layer to the second lower bonding pad, wherein the protruding portion of the via plug contacts the second lower bonding pad, such that the second lower bonding pad is connected to the via structure; and a third semiconductor chip including a third semiconductor substrate having an upper surface on which logic devices are located, a third wiring structure on the upper surface of the third semiconductor substrate, the third wiring structure in contact with the bonding insulating layer, the third wiring structure having a third wiring layer, and a third bonding pad exposed to an upper surface of the third wiring structure, the third bonding pad bonded to the second lower bonding pad, the third bonding pad connected to the third wiring layer.

* * * * *